US008144882B2

(12) United States Patent
Christoph et al.

(10) Patent No.: US 8,144,882 B2
(45) Date of Patent: Mar. 27, 2012

(54) SOUND TUNING METHOD

(75) Inventors: Markus Christoph, Straubing (DE); Leander Scholz, Salching (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 963 days.

(21) Appl. No.: 12/109,786

(22) Filed: Apr. 25, 2008

(65) Prior Publication Data

US 2008/0285775 A1    Nov. 20, 2008

(30) Foreign Application Priority Data

Apr. 25, 2007 (EP) .................... 07008457

(51) Int. Cl.
*H03G 3/20* (2006.01)
*G10L 15/00* (2006.01)

(52) U.S. Cl. .......................... 381/57; 704/258
(58) Field of Classification Search .............. 381/57–58, 381/104–107; 704/258, 275; 257/254, 416
See application file for complete search history.

(56) References Cited

U.S. PATENT DOCUMENTS

| 4,870,690 | A | 9/1989 | Negishi et al. | |
| 5,384,856 | A | 1/1995 | Kyouno et al. | 381/103 |
| 7,490,042 | B2 * | 2/2009 | Eide et al. | 704/270 |
| 8,050,926 | B2 * | 11/2011 | Huang | 704/258 |
| 2005/0063554 | A1 | 3/2005 | Devantier | |
| 2007/0025559 | A1 | 2/2007 | Mihelich et al. | 381/59 |

FOREIGN PATENT DOCUMENTS

| FR | 2890280 | 3/2007 |
| JP | 01185011 | 7/1989 |
| JP | 2005109969 | 4/2005 |
| KR | 1020050022648 | 3/2005 |

OTHER PUBLICATIONS

Allen et al., "Image Method for Efficiently Simulation Small-Room Acoustics", J. Acoust. Soc. Amer., vol. 65, No. 4, Apr. 1979.
Farina et al., "AQT—A New Objective Measurement of the Acoustical Quality of Sound Reproduction in Small Compartments", May 12-15, 2001, 110th AES Convention, Amsterdam, The Netherlands.
Azzali et al., "AQTtool an automatic tool for design and synthesis of psychoacoustic equalizers", Mar. 22-25, 2003, 114th AES Convention, Amsterdam, The Netherlands.
Olive et al.: "The Detection of Reflections in Typical Rooms", Journal of the Audio Engineering Society, vol. 37, No. 7/8, Jul. 1, 1989, pp. 539-553.
Arnaud et al.: "A Composite Model of the Auditory Periphery for Simulating Responses to the Complex Sounds", vol. 106, No. 4, Oct. 1999, pp. 1852-1864.

* cited by examiner

*Primary Examiner* — Calvin Lee
(74) *Attorney, Agent, or Firm* — O'Shea Getz P.C.

(57) ABSTRACT

The invention relates to a method for automated tuning of a sound system, the sound system comprising delay lines, equalizing filters, and at least two loudspeakers, the method comprising the steps of reproducing a useful sound signal through the loudspeakers, measuring sound pressure values at at least one location, providing a target transfer function for tuning the delay lines and the equalizing filters of the sound system, the target transfer function representing a desired transfer characteristics of the sound system, adjusting the delay of the delay lines, and adjusting amplitude responses of the equalizing filters such, that the actual transfer characteristics of the sound system approximates the target function.

19 Claims, 28 Drawing Sheets

SOUND TUNING METHOD

1. CLAIM OF PRIORITY

This patent application claims priority to European Patent Application serial number 07 008 457.9 filed on Apr. 25, 2007.

2. FIELD OF THE INVENTION

The invention relates to sound tuning, and in particular to automated sound tuning or equalizing in passenger spaces of motor vehicles.

3. RELATED ART

In motor vehicles, particularly in premium class vehicles, the sound systems are typically very complex and comprise a multiplicity of loudspeakers at the most varied positions in the passenger space of such vehicles, using loudspeakers and groups of loudspeakers for different frequency ranges (for example subwoofers, woofers, mid-frequency loudspeakers and tweeters, etc.). Such sound systems are manually adjusted or optimized by acousticians or sound engineers for the respective vehicle type in order to achieve a desired sound impression. This process is also called sound tuning which is mainly tuning of the sound system and is subjectively performed by the acousticians or sound engineers mainly on the basis of experimental values and on the basis of the trained hearing. Typical arrangements for signal processing used in connection with sound tuning are biquadratic filters (e.g., high-pass, band-pass, low-pass, all-pass filters), bilinear filters, digital delay lines, cross-over filters and arrangements for changing the dynamic range of the signal (e.g., compressors, limiters, expanders, noise gates etc.) where the relevant parameters of the cut-off frequencies of the cross-over filters, of the delay lines and of the amplitude response are adjusted in such a manner that a sound impression is achieved which is optimized with regard to its spectral balance (tonality) and auditory perspective.

The focus of such tuning is to achieve as good as possible a sound impression at all listening positions, i.e. all seat positions in the passenger space of a passenger car. However, a multiplicity of parameters have to be changed in this process that cannot be adjusted independently of one another and interact in their effect so that the procedure results in an iterative process which requires a high degree of experience, is correspondingly time-consuming and inevitably orientates itself largely around the subjective sound impression of the acoustician or sound engineer performing the tuning of the sound system.

Therefore, there is a need for techniques of providing for at least partially automated tuning of sound systems in motor vehicles.

SUMMARY OF THE INVENTION

According to one embodiment of the invention a method for automated tuning of a sound system having delay lines, equalizing filters, and at least two loudspeakers comprises the steps of reproducing a useful sound signal through the loudspeakers, measuring sound pressure values at at least one location, providing a target transfer function for tuning the delay lines and the equalizing filters of the sound system, the target transfer function representing a desired transfer characteristic of the sound system, adjusting the delay of the delay lines, and adjusting amplitude responses of the equalizing filters such that the actual transfer characteristics of the sound system approximates the target function.

According to another embodiment of the invention a system for automated tuning of a sound system comprises a signal source for providing a useful sound signal, a plurality of adaptive filters, where one of the plurality of adaptable filters is connected downstream of each cross-over filter, a plurality of loudspeakers, where one of the plurality of loudspeakers is connected downstream of each adaptive filter, a microphone for measuring a sound pressure level located at a first positions and providing a microphone signal representing the useful sound signal, a control unit for optimizing filter coefficients of the adaptive filters such that the actual transfer characteristics defined by the useful sound signal and the microphone signal approximates a target function that represents a desired transfer characteristic of the sound system.

DESCRIPTION OF THE DRAWINGS

The present invention can be better understood with reference to the following drawings and the description. The components in the figures are not necessarily to scale, emphasis instead being placed upon illustrating the principles of the invention. Moreover, in the figures, like reference numerals designate corresponding parts throughout the different views.

DETAILED DESCRIPTION

Figure 1A:
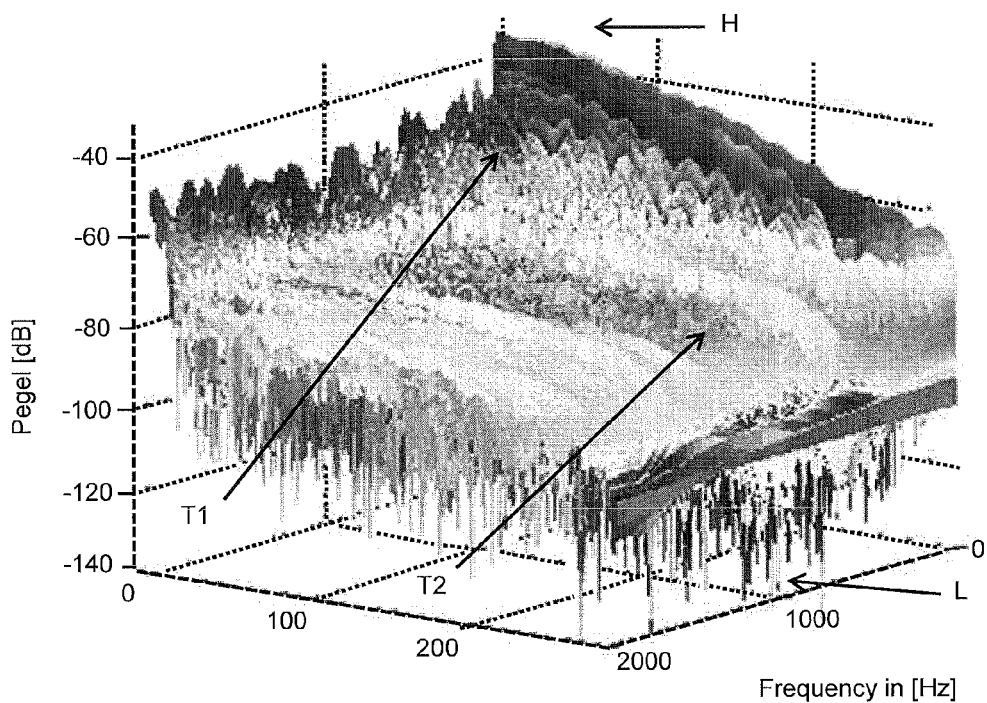
FIGS. 1A-1D show three-dimensional views of an energy decay curve of the impulse responses of the sound system according to the linear-, delay-, filter-, and tuning-set, respectively.

In the present case, investigations have been conducted in order to determine first how acoustic parameters are changed when tuning is performed by trained acousticians or sound engineers. As a test environment, a premium class limousine has been selected. The sound system of this vehicle comprises a total of 10 channels (FrontLeft (LF), FrontRight (FR), Center (C), SideLeft (SL), SideRight (SR), RearLeft (RL), RearRight (RR), SubwooferLeft (SubL), SubwooferRight (SubR), a separate subwoofer (Sub)) located in the trunk and an amplifier for each channel. The tuning is performed using both phase tuning by changing the parameters of delay lines, all-pass filters and cross-over filters, and frequency tuning by changing the parameters of biquadratic, bilinear filters and cross-over filters. The separate subwoofer placed in the trunk of the vehicle is an active loudspeaker operated with a low-pass filter having a 100 Hz cut-off frequency, 90° phase shift, and volume set to the center position.

The sound impression of the sound system of the vehicle is tuned as it is conventionally done when tuning sound systems in motor vehicles, in accordance with conventional manual procedure by acousticians with emphasized optimization for the two front seat positions (driver and co-driver), the main attention here in turn being paid to the driver position in accordance with the typical procedure. Also in accordance with the typical procedure, the rear seat positions are also taken into consideration during the tuning process, but only to an extent which does not result in any negative impairment of the hearing impression on the front seat positions. During the tuning, a surround-algorithm (e.g. LOGIC7® audio signal processing available from the assignee of the present invention) available in the sound system used is switched off and only tuning for the case of pure stereo signals is performed.

After completion of the manual tuning, measurements of the impulse response of the total system are performed at four positions in the passenger space (front left (driver), front right (co-driver), rear left and rear right). During this process, the total impulse response was determined in four steps, firstly of the untuned sound system, of the completely tuned sound system, of the sound system tuned only with regard to phase (delay lines) and of the sound system tuned only with regard to the level variation or amplitude response, respectively. These overall impulse responses are then subjected to an analysis.

There is a multiplicity of possibilities for analyzing the measured impulse responses. Thus, for example, the complete impulse responses present in the time domain can be compared with one another or these can be subjected in advance to suitable filterings and then compared with one another in the time domain. Furthermore, the measured impulse responses can be transformed into the frequency domain in order to extract and to compare the static frequency response (amplitude and phase response) or the associated static group-delay response.

A further possibility includes investigating the dynamic characteristics of the impulse response and to evaluate these, for example, by the energy decay curve, the phase decay curve or also the group-delay decay curve. A further possibility is to concentrate only on the minimum-phase component (the component without time offset) of the impulse response during the investigations or to consider only the all-pass-containing component of the impulse response (the component with frequency-dependent phase shift). The examples mentioned only represent a section from the possible range of investigation variants.

Initially, it had been a further focus of the investigation to select the analysis method that represents the basis for the best results of the evaluation and analysis of the impulse responses. After using and checking a multiplicity of different analyses of the impulse responses measured, the energy decay curve has then been selected as analysis method.

Further, the impulse responses are additionally investigated for their dynamic characteristics with single sinusoidal pulses being used as excitation signals for the sound system, their frequency being increased step-by-step in accordance with the psychoacoustic Bark scale. In this method (the so-called Liberatore method), the psychoacoustic characteristics of the human ear are utilized, particularly the frequency-dependent integrating characteristic of the human ear. In this context, the starting point for modeling the psychoacoustic hearing sensations are the fundamental characteristics of the human ear, particularly of the inner ear. The human inner ear is embedded in the so-called "temporal bone" and filled with incompressible lymphatic fluid. The inner ear has the shape of a snail (cochlea) with approximately 2.5 turns. The cochlea, in turn, includes parallel canals, the upper and lower canal being separated by the basilar membrane. On this membrane, the organ of Corti is located with the sensual cells of the ear. If the basilar membrane is made to vibrate due to sound stimuli, so-called traveling waves are formed, that is to say there are no nodes or antinodes. In this way, an effect which is determined for the hearing process is produced, the so-called frequency/locus transformation on the basilar membrane which explains, amongst other things, psychoacoustic masking effects and the distinct frequency selectivity of the ear.

The human ear combines various sound stimuli falling within limited frequency bands (integrating function). These frequency bands are called critical bands or also critical bandwidth CB. The critical bandwidth has its basis in that, the human ear combines sounds that occur in particular frequency bands with regard to psychoacoustic hearing sensations produced by these sounds to form a joint hearing sensation. Sound events located within a critical band influence each other differently from sounds which occur in different critical bands. For example, two tones having the same level within one critical band are perceived more quietly than when they are located in different critical bands.

Since a test tone within a masker can be heard when the energies are identical and the masker falls into the frequency band which has the frequency of the test tone as center frequency, the required bandwidth of the critical bands can be determined. At low frequencies, the critical bands have a bandwidth of 100 Hz. At frequencies above 500 Hz, the critical bands have a bandwidth which is about 20% of the center frequency of the respective critical band (Zwicker, E.; Fastl, H. Psychoacoustics—Facts and Models, 2nd Edition, Springer-Verlag, Berlin/Heidelberg/New York, 1999).

By lining up all the critical bands over the entire hearing range, a hearing-oriented non-linear frequency scale is obtained which is called critical-band rate scale (tonality) that has the unit Bark. It represents a distorted scaling of the frequency axis such that critical bands are the same width of exactly one Bark at any point. The nonlinear relationship of frequency and critical-band rate scale has its origin in the frequency/locus transformation on the basilar membrane. The critical-band rate scale function was specified by Zwicker in table form (Zwicker, E.; Fastl, H. Psychoacoustics—Facts and Models, 2nd Edition, Springer Verlag, Berlin/Heidelberg/New York, 1999) on the basis of masking threshold and loudness investigations. It is found that just 24 critical bands can be lined up in the auditory frequency band from 0 to 16 kHz so that the associated critical band-rate scale is 0 to 24 Bark.

For the application of the above-mentioned Liberatore method, the excitation of the sound system by sinusoidal pulses begins at about 20 Hz and is correspondingly increased followed by a pause in each case. Following this, the sinusoidal pulses are convoluted with the respective impulse response to be analyzed as a result of which a result similar to the energy decay curve is again achieved which allows a further penetrating analysis of the behavior of the sound system in the passenger space of the motor vehicle.

The results achieved with the aid of the energy decay curves described above are first shown, namely for the overall impulse responses, measured in four steps, of the untuned sound system, of the completely tuned sound system, of the sound system only tuned with regard to phase (delay lines, cross-over filters) and of the sound system, only tuned manually by acousticians or sound engineers with regard to the level variation or amplitude response, respectively (biquadratic filters, bilinear filters) of the limousine under investigation. These energy decay curves are represented in a three-dimensional view in FIG. 1.

The curves shown in FIG. 1 are only within a frequency range of up to f=2 kHz since this represents the determining part-area of the audio frequency range with regard to the sound sensations of auditory perspective and tonality to be investigated. The extent of the three-dimensional representations with time is restricted to about t=280 ms since it can be assumed that after this time, any signal of the sound system excited by a pulse has decayed in the interior space of the vehicle to the extent that the impulse response provides no further contribution with regard to the sound sensations of auditory perspective and tonality to be investigated.

Figure 1B:
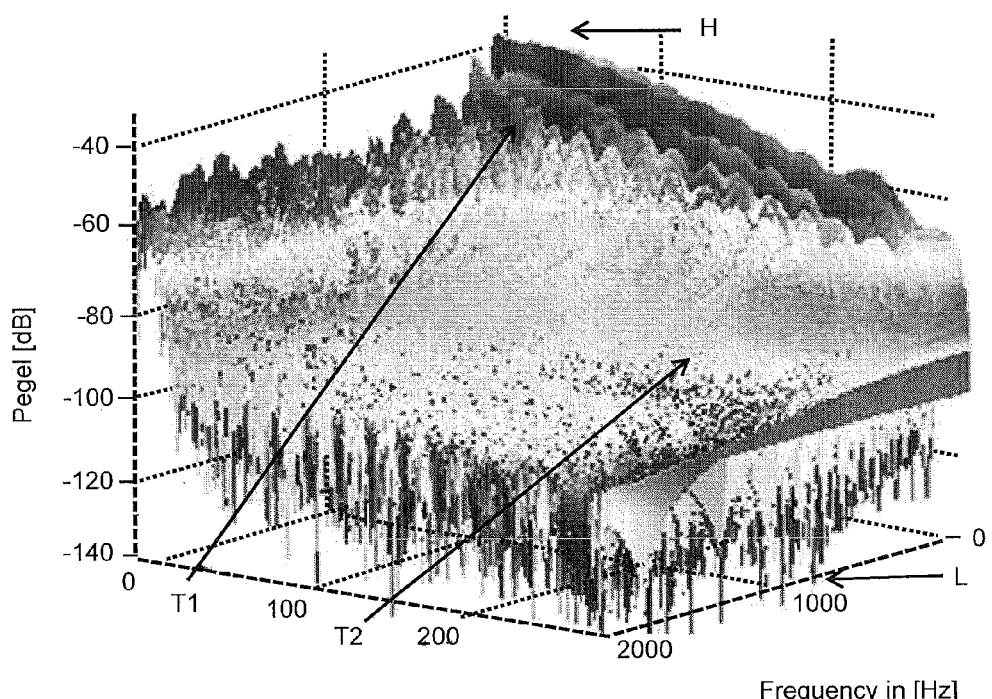
Figure 1C:
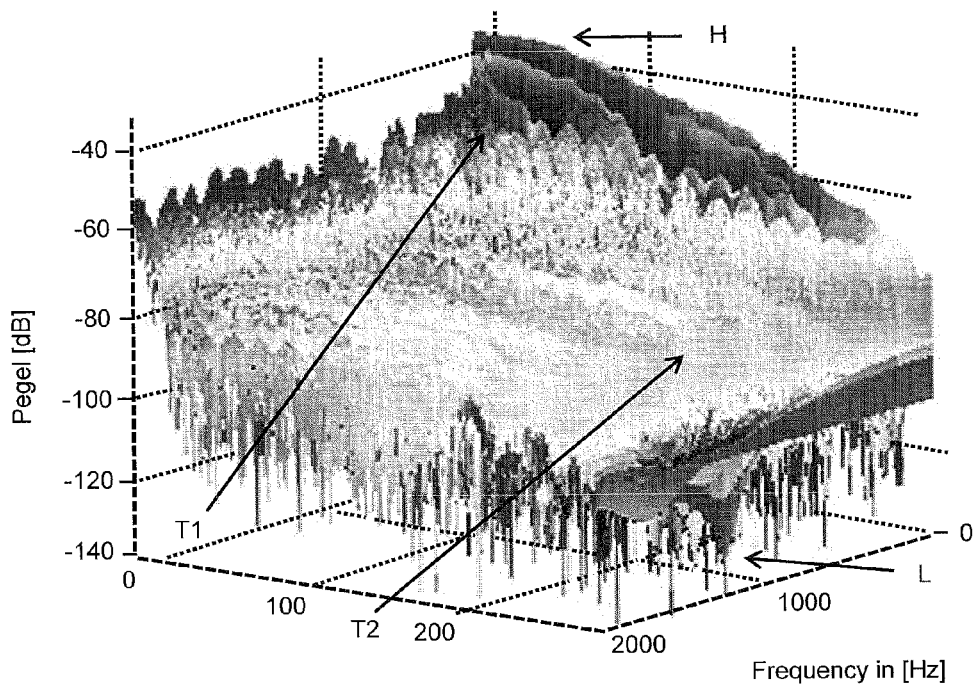

FIGS. 1A-1D comprises four three-dimensional representations of the energy decay curves (EDC) determined. In all four representations, the Y axis designates the time in ms after the corresponding sinusoidal pulse has been presented, the X axis designates the level measured in each case at this time and the Z axis designates the frequency of the respective sinusoidal pulse, the frequency being plotted along the Z axis from high frequencies towards low frequencies in these representations. Furthermore, areas marked with H represent high measured levels and areas marked with L show low measured levels. The transition from high levels (H) to low levels (L) is identified by T1 and T2. FIG. 1A shows the energy decay curve for the sound system of the vehicle which is initially not tuned, also called linear set in the following. The representation in FIG. 1B shows the energy decay curve for the sound system of the vehicle tuned with regard to phase (delay lines, cross-over filters), the adjustments used also being called delay set in the following. The representation in FIG. 1C shows the energy decay curve for the sound system of the vehicle tuned additionally with regard to the level variation or the amplitude response, respectively, (biquadratic filters, bilinear filters) in a further step, the adjustments used also being called filter set in the following. The representation in FIG. 1D finally shows the energy decay curve for the sound system of the vehicle completely tuned in the iterative method described above, this iterative process comprising alternating retuning both of the biquadratic and bilinear filters and of the delay lines and of the cross-over filters in order to reach the final adjustment of the sound system. The adjustments used during this process are also called tuning-set in the following.

From the energy decay curve of the impulse response in the interior vehicle space for the sound system initially not tuned, it can be seen from FIG. 1A, that the direct sound exhibits strong fluctuations and the reverberation is long and energy-rich in many frequency bands. The tuning of the sound system usually begins with tuning the cross-over filters and the delay lines. According to experience, this represents the most lengthy and difficult work in the tuning of a sound system. After the cross-over filters and the delay lines have been adjusted for adjusting the phase of the sound system in the vehicle, an impulse response is measured in the present case, the energy decay curve of which is shown at the top right (delay set). It can be clearly seen that a delay tuning (adjustment of the phase) performed manually by experienced acousticians primarily reduces/minimizes the reverberation in order to approach the desired sound impressions for auditory perspective and tonality.

FIG. 1C is the energy decay curve of the sound system for the case where the equalizer filters (the biquadratic and bilinear filters) were manually tuned (filter set) in addition to the cross-over filters and delay lines in a further non-iterative step. It can be seen that good equalizing of the amplitude response results in the reduction of individual spatial modes occurring increasingly due to resonances of the room acoustics of the vehicle space, and a certain smoothing of the direct sound which thus essentially improves the tonality.

Figure 1D:
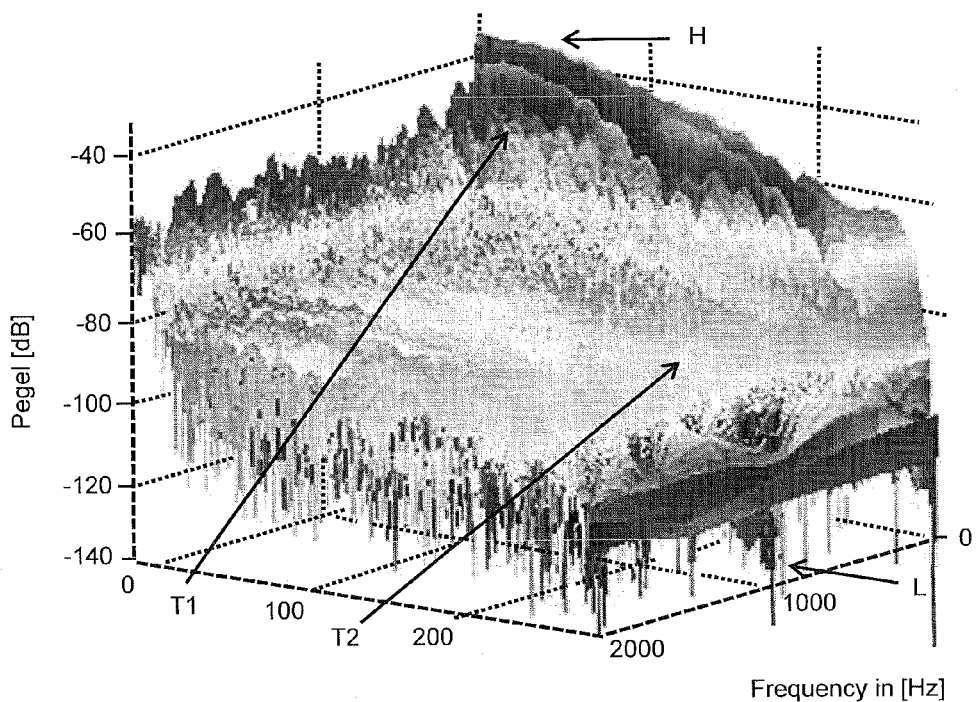

Referring to FIG. 1D, the image at the bottom right shows the energy decay curve of the completely tuned vehicle (tuning set). In this case, the iterative procedure described above was now used in the tuning of the components of the sound system, that is to say especially the repetitive alternate tuning both of the biquadratic and bilinear filters and of the delay lines and of the cross-over filters in order to achieve the final adjustment of the sound system with regard to the desired sound effect with respect to auditory perspective and tonality. In this context, from the representation in FIG. 1D it can be seen that the adjustments made now lead to a type of compromise between the results of the phase tuning and of the amplitude tuning. On the one hand, the reverberation is no longer suppressed as much as in pure delay tuning (phase) and, on the other hand, some spatial modes are again emphasized a little more than was the case in pure filter tuning (amplitude response).

To illustrate the relationships, the top view of the three-dimensional impulse responses of the sound system is chosen in FIGS. 2A-2D as additional types of representation since further features of the tuning of the sound system can be seen better from this type of representation. The X axis designates the frequency of the sinusoidal pulses in Hz in all representations according to FIGS. 2A-2D, the y axis designates the time after the end of the presentation of the sinusoidal pulse. Furthermore, areas marked H again represent high measured levels and areas shown in L represent low measured levels. The transition from high levels (H) to low levels (L) is identified by T1 and T2. FIGS. 2A-2D again comprise the representation of the energy decay curves of the measured impulse responses of the sound system used in the investigations for the cases of the untuned sound system (linear set, top left), of the sound system tuned with regard to phase (delay set, top right), of the sound system additionally tuned with regard to amplitude response (filter set, bottom left) and the sound system completely tuned in the iterative method (tuning set, bottom right).

Figure 2A:
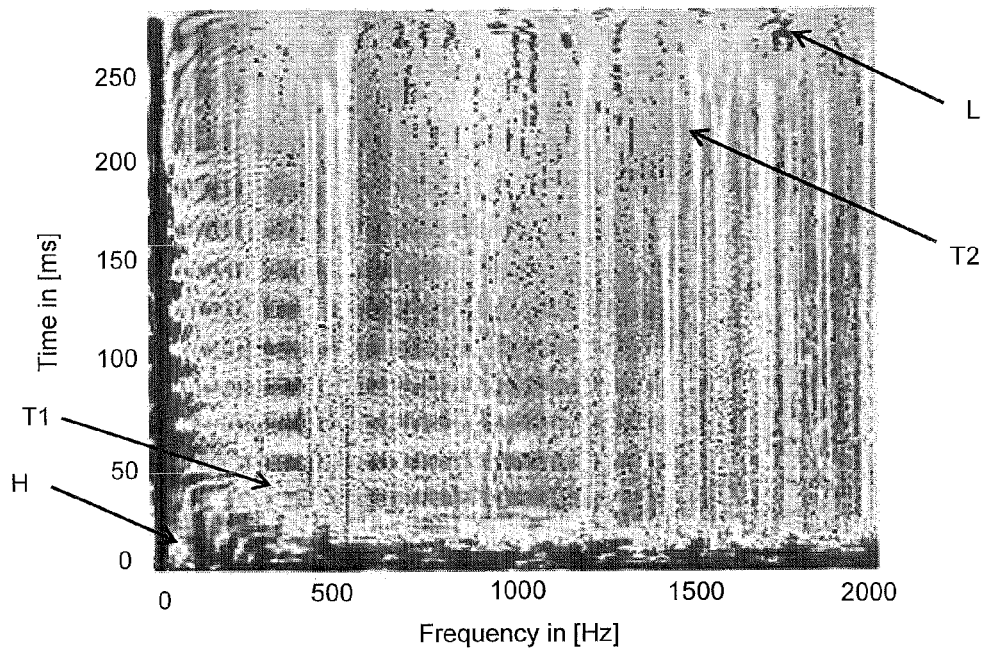
FIGS. 2A-2D illustrate three-dimensional energy decay curves of the impulse responses of the linear-, delay-, filter-, and tuning-set, respectively.
Figure 2B:
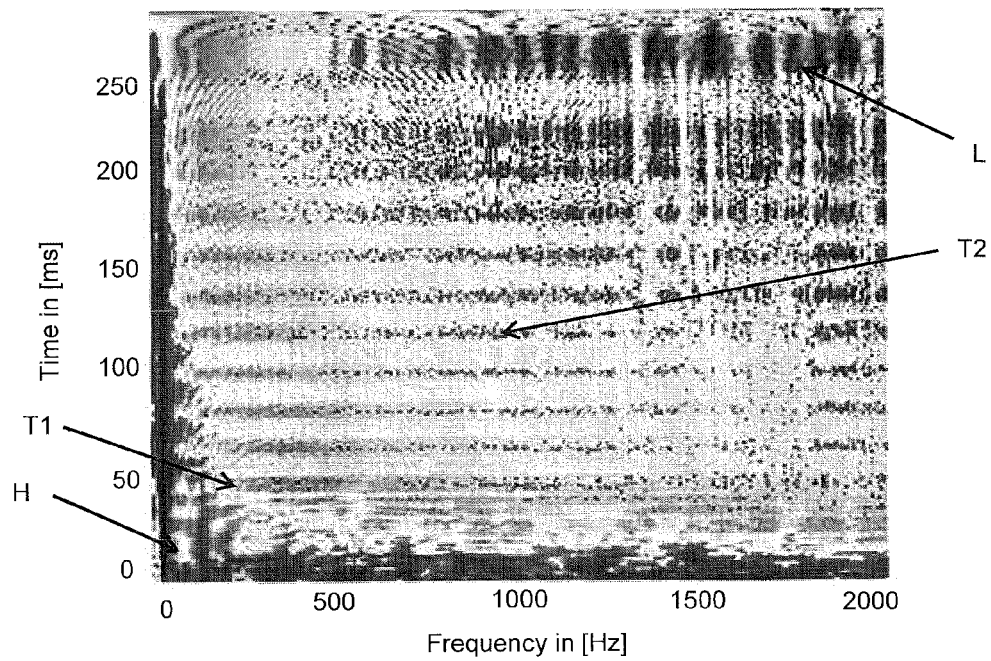
Figure 2C:
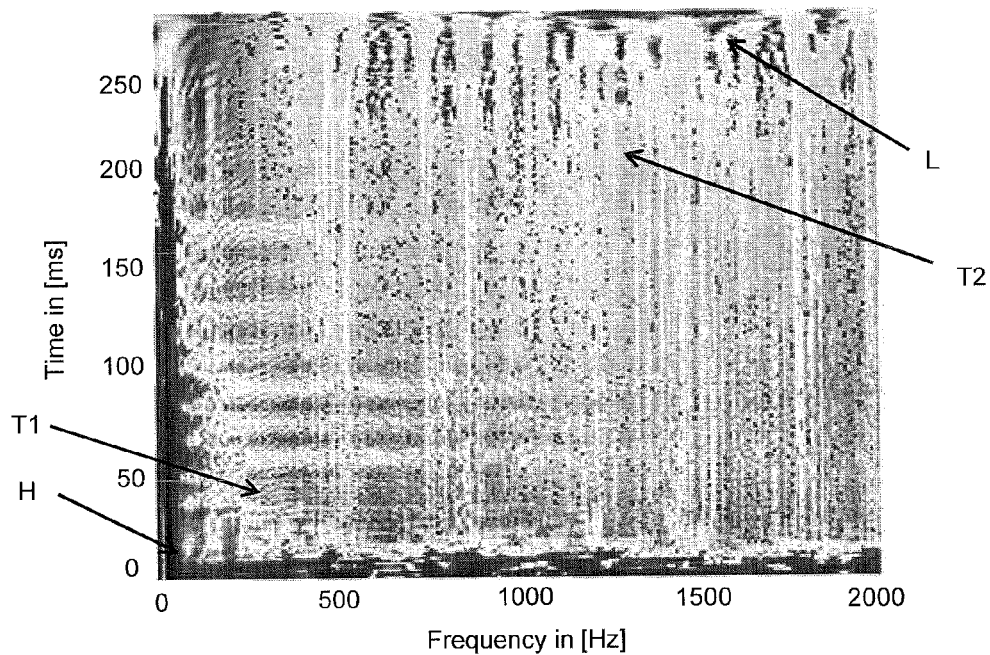
Figure 2D:
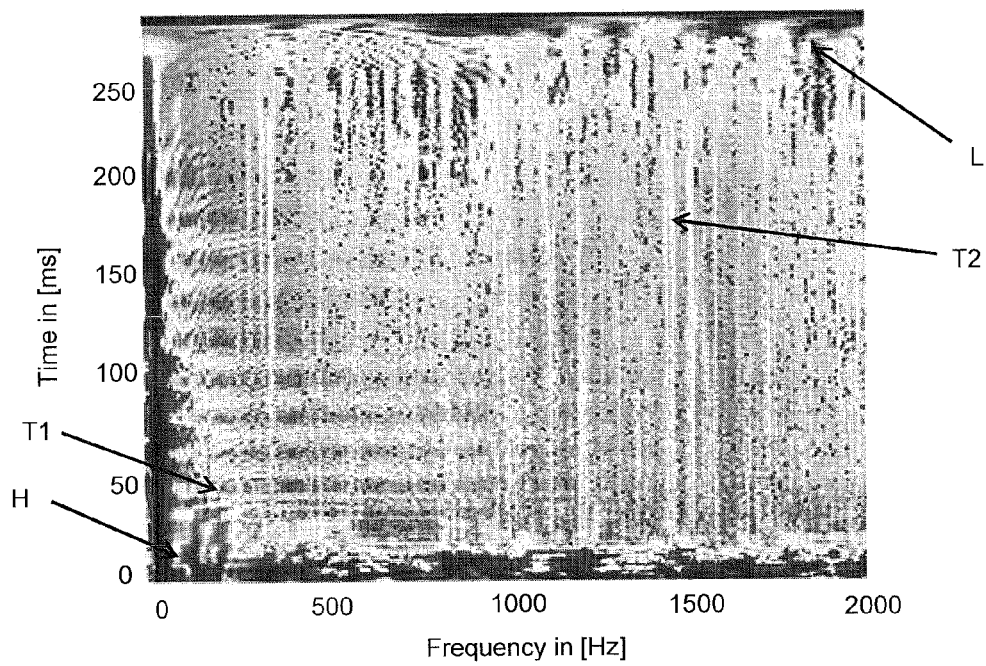

Referring to FIG. 2A it can be seen, for example, that even delay tuning (phase) performed well does not have any or only very little influence on the reverberation time at low frequencies and the duration of the reverberation drops approximately exponentially from the low frequencies towards the high frequencies. Furthermore, it can be easily seen from this type of representation how equalizing of the amplitude response (see FIG. 2C) is capable of distinctly reducing or suppressing, respectively, individual spatial modes in comparison with the untuned sound system of the vehicle (image at the top left in FIG. 2A). Furthermore, it can be seen that, analogously to the representations in FIGS. 1A-1D some spatial modes are again emphasized more, and the reverberation has become partly much stronger in the center frequency band than had still been the case when only the cross-over filters and the delay lines were tuned with regard to phase (delay set) due to the compromise between optimum adjustment of the phase and amplitude response in the completely and iteratively tuned sound system of the vehicle.

As is already known from the experience of acousticians in the tuning of sound systems in motor vehicles, good equalizing of the amplitude response mainly improves the tonality and good delay tuning primarily improves the auditory perspective. The qualitative influence of tuning of the amplitude response had already been expected from the start to be thus, namely the smoothing of the entire transfer function and reduction of some especially prominent spatial modes. An essential result not yet known in this form, however, is represented by the mutual influence of the delay tuning and of the equalizing of the amplitude response.

Thus, it can be seen from the investigations, for example, that the delay tuning for optimizing the phases at the same time leads to a displacement of the excitation energy in the passenger space measured that represents equalizing of the amplitude response performed implicitly at the same time as the delay tuning. In many areas, this can appear as an improvement with regard to the sound impression and accordingly as desirable but in other areas as a deterioration and thus as undesirable, in contrast. Furthermore, this displacement of the energy of the measured impulse response with respect to frequency results in an excitation of some new spatial modes which have previously not occurred but, at the same time, also to the weakening of other spatial modes which were previously more prominent.

Apart from the aforementioned desirable effects, equalizing the amplitude response with the aid of the parametric filters leads to some negative and thus unwanted results since these filters, for tuning the required amplitude response, at the same time have a phase response which is uncontrollable in the tuning process and which has a negative effect on the phase tuning previously performed by the delay lines and thus leads to an increase in the reverberation energy or, respectively, to a reduction in the auditory perspective. At the same time, however, the investigations indicated that long reverberation times at very low frequencies apparently do not have any negative effect on the spatial perception since very long reverberation times were still registered in the relevant frequency range and even after an optimally performed phase or delay tuning.

From the analysis of the investigations performed, it can be derived that in the tuning of a sound system, the amplitude response should only be equalized after the delay tuning has been completely concluded since the delay tuning contributes to a displacement of excitation in the frequency of the spatial modes and, therefore, leads to a further changed adjustment of the entire resultant equalizing overall. Tuning of the amplitude response should, therefore, be applied exclusively to the spatial modes remaining after the delay tuning and for equalizing the frequency responses of the loudspeakers and loudspeaker installations.

It is also desirable to implement the tuning of the amplitude response with zero-phase or linear-phase filters so that the result of the phase tuning previously achieved, and thus the spatial image and the staging of the audio signals reproduced by the tuned sound system remain unaffected. At the same time, however, zero-phase filters can only be implemented in the spectral domain. Linear-phase filters can be of such a type that, assuming axially symmetric tuning for all channels of the sound system, a constant phase offset is produced. This makes it possible to achieve the equalizing of the amplitude response that does not have any undesirable effects on the phase tuning and can thus be considered separately. This considerably simplifies the entire tuning process since proceeding in this way eliminates the interdependence or mutual influence between phase and amplitude tuning. Phase tuning is implemented only by combining the tuning of cross-over filters and delay lines as in the investigations described.

In addition, further improved results can be achieved if the acoustician performing the tuning of the sound system is provided, instead of the delay lines or as a supplement to these, with the possibility of adjusting an arbitrary phase shift over the frequency (adjustable group delay). This makes it possible to achieve much better suppression of the reverberation and thus better staging especially in the range of low frequencies and the results achieved already by tuning the delay lines can be further improved.

Figure 3A:
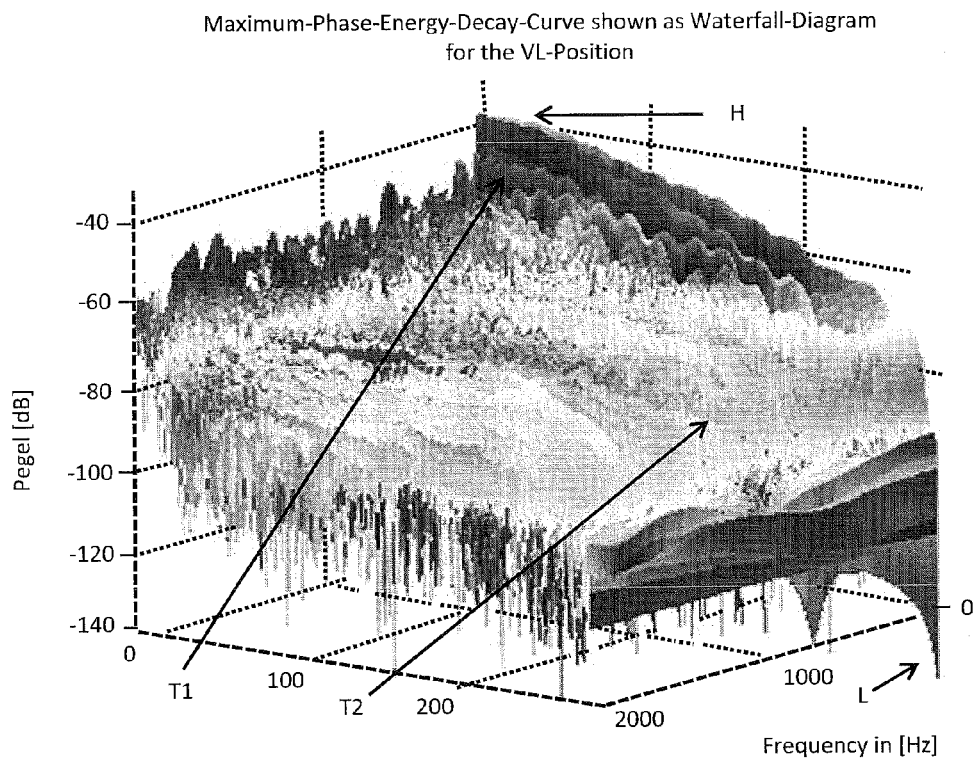
FIGS. 3A-3B are three-dimensional and top views, respectively, of the energy decay curve of the impulse response when tuning the delay lines without at the same time tuning the cross-over filters.

To further investigate the influence of the cross-over filters on the suppression of the reverberation, a measurement with exclusive tuning of the delay lines, that is to say without simultaneously tuning the cross-over filters, was additionally performed apart from the measurements shown in FIGS. 1 and 2. The associated measurement results are shown in FIGS. 3A-3B and very clearly show the influence of the cross-over filters on the phase tuning.

Figure 3B:
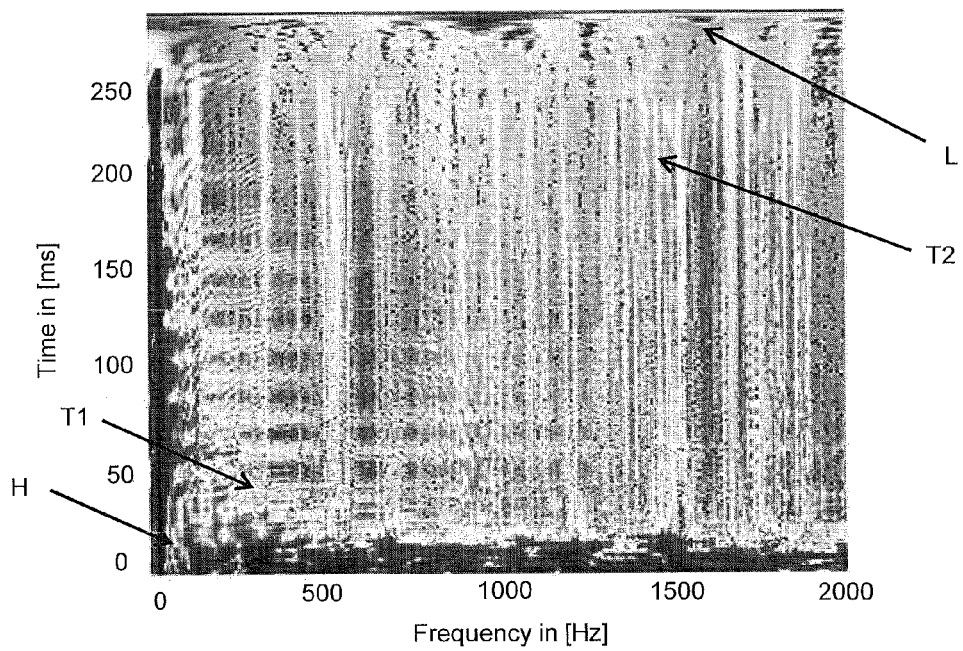

FIG. 3A again shows a three-dimensional view of the measured energy decay curves for sinusoidal pulses analogously to FIG. 1, and in FIG. 3B the top view of this three-dimensional representation analogous to the representations in FIG. 2. In comparison with the corresponding representations in FIGS. 1B and 2B, the representations in FIG. 3 easily show that the reverberation is partly increased considerably in certain frequency ranges without simultaneous tuning of the cross-over filters. This indicates that it is only the combination of tuning the cross-over filters and the delay lines which leads to a significant reduction in the reverberation energy. It is left to clarify whether it is primarily the phase response of the cross-over filters or their selective effect for the corresponding loudspeakers which is the cause that their joint tuning leads to a considerable reduction in the reverberation energy.

The influence of the phase response of the filters used for equalizing the amplitude response is already known from the corresponding representations in FIGS. 1A-1D and 2A-2D and moves within a similar order of magnitude as the influence by tuning the cross-over filters. It can be clearly seen from the results of the investigation shown with reference to FIG. 3A-3D that the correct setting of the cross-over filters is of enormous significance for a good result of the tuning, especially for forming a good auditory perspective.

In this context, the question arises as to why the spatial perception or localization of acoustic events is so strongly dependent on the form of decrease in reverberation time or reverberation energy, respectively. This problem can be explained with the aid of the so-called Haas effect. Haas determined that especially the first reflections can lead to an improvement, but also to an impairment, of the spatial perception, depending on when and with what amplitude these reflections arrive at the location to be examined. According to the results of the investigation by Haas, poor spatial perception is obtained whenever the first reflections arrive very early (approximately 10-20 ms after the direct sound) and additionally have a high amplitude.

Both conditions are usually encountered in the passenger spaces of motor vehicles. This is why the spatial perception is always poor in a vehicle and can only be improved if the energy-rich first reflections decay as early as possible or these reflections are attenuated very greatly. This required attenuation of the reflections is performed with the aid of phase tuning since individual loudspeakers representing the acoustical signal sources of the sound system can be delayed here in such a manner that the sum of the sound events becomes superimposed at the relevant location as desired in such a manner that it leads to only a slight reverberation.

The question also arises in this context as to why a reverberation time which is high in the low frequency range and decreases toward high frequencies does not have any apparent negative effect on the spatial perception. This question can be answered with the aid of the physiology of our ear, particularly the operation of the basilar membrane of the inner ear. The basilar membrane is attached to the eardrum at one end and is then rolled up within the cochlea. Starting from the eardrum, it decreases in thickness. At the thick end of the basilar membrane which is attached to the eardrum, the basilar membrane is caused to vibrate by high frequencies in the form of a travelling wave and the closer the thin end of the basilar membrane is approached, it is caused to vibrate by lower frequencies. The distribution of the frequencies on the basilar membrane corresponds to the Bark scale shown further above.

If then the basilar membrane is excited by a sound stimulus via the eardrum, it is mechanically caused to vibrate at different positions along its extent in the form of a travelling wave corresponding to the frequency content of the sound stimulus. Vibrations, once they have been excited, decay rapidly at the thick front end (close to the eardrum) and comparatively slowly at the thin rear end of the basilar membrane. This decaying process leads to sound stimuli arriving additionally in the vibrating areas of the basilar membrane during this process not being perceived (and thus do not need to be taken into consideration for example during the tuning of a sound system) when they relate to the same area of the basilar membrane and are below a certain level. This effect is described in psychoacoustics and is called masking.

Numerous investigations have shown that masking effects can be determined for every human ear (see, for example, Moore, B. C. J.: An Introduction to the Psychology of Hearing, Academic, London, 1992 and Zwicker, E.: Psychoacoustics, Springer Verlag, Berlin Heidelberg, 1990). In contrast to other psychoacoustic perceptions, individual differences are scarcely apparent and can be neglected so that a generally valid psychoacoustic model of masking can be derived. In the present case, the psychoacoustic aspects of masking are applied to achieve a meaningful specification for the necessary reduction of, for example, spatial modes or reverberation without unnecessarily increasing the associated technical expenditure for tuning the sound system as required. Furthermore, these masking effects are also used, in particular, for determining the necessary parameters for an at least partially automated tuning of a sound system.

In the psychoacoustic effect of masking, a distinction is made between two essential forms of masking which leads to different variations of masking thresholds. These are the simultaneous masking in the frequency domain and the temporal masking in the time domain. In addition, mixed forms of these two types of masking occur in signals such as environmental noises or music.

In the case of simultaneous masking, masking sound and useful signal occur at the same time. To investigate this effect, test signals and masking noises are offered to different test subjects of different age and sex. If the shape, bandwidth, amplitude and/or frequency of the maskers is changed in such a manner that the test signals, which are frequently sinusoidal just become audible, the masking threshold for simultaneous masking can be determined over the entire bandwidth of the audible range, i.e., essentially for frequencies between 20 Hz and 20 kHz.

Figure 4:
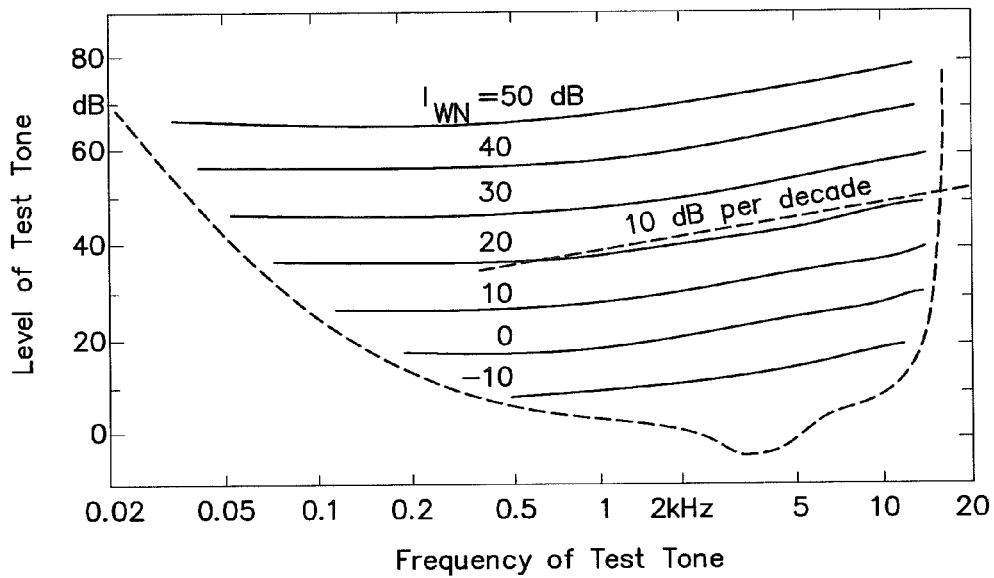
FIG. 4 is a diagram illustrating the masking thresholds of white noise over frequency.

FIG. 4 shows the masking of a sinusoidal test tone by white noise. It shows the sound intensity of a test tone, which is just masked by white noise with the sound intensity $1_{WN}$, in dependence on its frequency where the threshold of audibility being shown dashed. The masking threshold of a sinusoidal tone when masked by white noise is obtained as follows: below 500 Hz, the masking threshold of the sinusoidal tone is approx. 17 dB above the sound intensity of the white noise. From 500 Hz onward, the masking threshold rises at approx. 10 dB per decade or, respectively, approx. 3 dB per octave, corresponding to a doubling in frequency.

The frequency dependence of the masking threshold is obtained from the different critical bandwidth (CB) of the ear at different center frequencies. Since the sound intensity falling into a critical band is combined in the perceived auditory sensation, a higher total intensity is obtained at high frequencies in wider critical bands with white noise with frequency-independent level. Accordingly, the loudness of the sound, i.e., the perceived sound intensity also increases and leads to increased masking thresholds. Thus, the purely physical quantities such as, for example, sound pressure level of a masker, are not sufficient for modeling the psychoacoustic effect of the masking, that is to say for deriving the masking threshold or the masking, respectively, from measurement quantities such as sound levels and intensities, but psychoacoustic quantities such as the loudness N must be used. The spectral distribution and the variation with time of masking sounds also play a significant role in this context which also becomes apparent from the following representations.

If the masking threshold is determined for narrow-band maskers such as, for example, sinusoidal tones, narrow-band noise or noise with critical bandwidth, it is found that the resultant spectral masking threshold compared with the threshold of audibility, is also raised in areas in which the masker itself does not have any spectral components. The narrow-band noise used is noise with critical bandwidth, the level of which is called $L_{CB}$.

Figure 5:
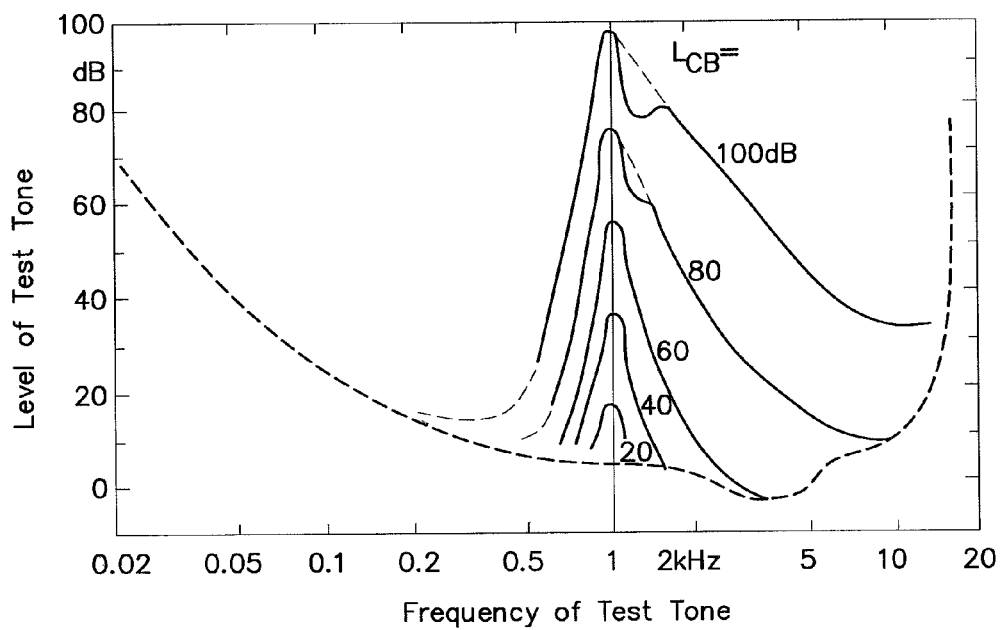
FIG. 5 is a diagram illustrating the masking thresholds depending on the sound pressure level of narrow-band noise.

FIG. 5 shows the masking thresholds of sinusoidal tones which are measured by noise of critical bandwidth of center frequency $f_c$ of 1 kHz as masker and various sound levels in dependence on the frequency $f_T$ of the test tone with the level $L_T$. As in FIG. 4, the threshold of audibility is shown dashed. It can be seen from FIG. 5 that, when the level of the masker is raised by 20 dB, the peaks of the masking thresholds also rise by 20 dB in each case and are thus linearly dependent on the level $L_{CB}$ of the masking noise with critical bandwidth. The lower edge of the measured masking thresholds, that is to say the masking extending in the direction of low frequencies less than the center frequency $f_C$, has a steepness of about 100 dB/octave which is independent of the level $L_{CB}$ of the masker.

At the upper edge of the masking thresholds, this great steepness is only achieved for levels $L_{CB}$ of the masker which are lower than 40 dB. As the levels $L_{CB}$ of the masker become greater, the upper edge of the masking threshold becomes increasingly flatter and the steepness is about –25 dB/octave at $L_{CB}$ 100 dB. Thus, the masking extending in the direction of the higher frequencies with respect to the center frequencies $f_C$ of the masker extends far beyond the frequency band in which the masking sound is presented. The ear behaves in a similar manner at other center frequencies than 1 kHz for narrow-band noise with critical bandwidth. The edge steepnesses of the upper and lower edge of the masking threshold are almost independent of the center frequency of the masker as can be seen from FIG. 6.

Figure 6:
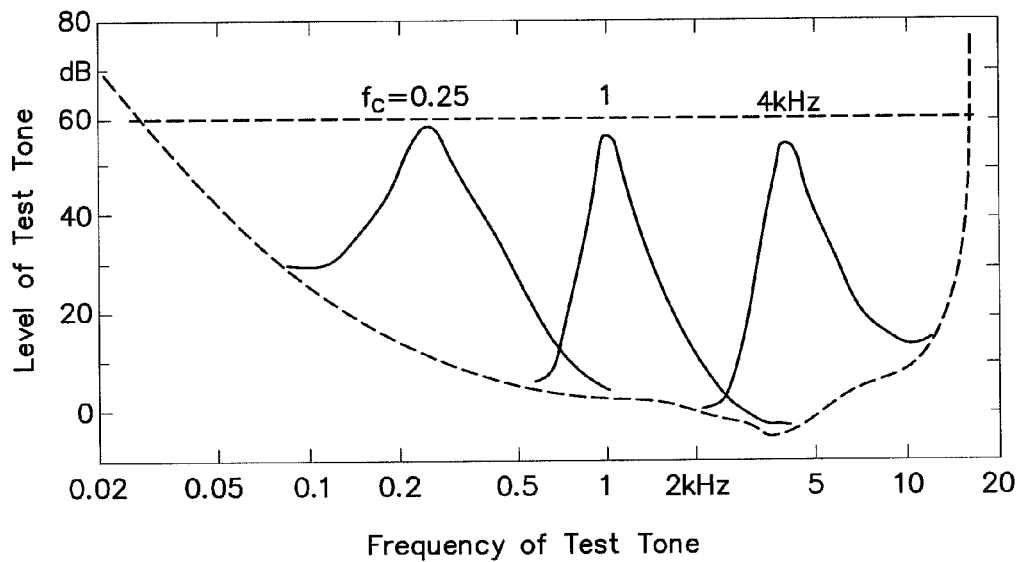
FIG. 6 is diagram illustrating the masking thresholds with critical-band-wide narrow-band noise.
Figure 7:
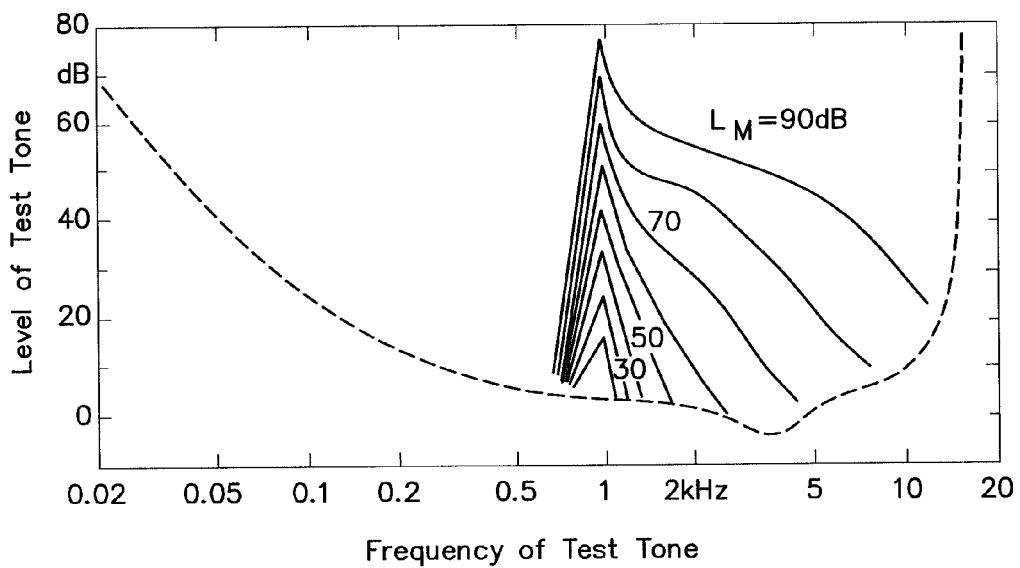
FIG. 7 is diagram illustrating the masking thresholds of sinusoidal tones.

FIG. 6 shows the masking thresholds for maskers from narrow-band noise with critical bandwidth with the level $L_{CB}$=60 dB and three different center frequencies of 250 Hz, 1 kHz and 4 kHz. The apparently flatter course of the steepness of the lower edge for the masker of center frequency 250 Hz is caused by the transition into the threshold of audibility which is already at higher levels at this low frequency. Effects such as that shown are also included in the implementation of a psychoacoustic model of the masking. The threshold of audibility is again shown dashed in FIG. 6. If the sinusoidal test tone is masked by another sinusoidal tone of frequency 1 kHz, masking thresholds as shown in FIG. 7 are obtained in dependence on the frequency of the test tone and the level of the masker $L_M$. As already described above, the so-called fanning-out of the upper edge in dependence on the level of the masker can be clearly seen whereas the lower edge of the masking threshold is almost frequency- and level-independent. For the upper edge steepness, about –100 to –25 dB/octave are obtained in dependence on the level of the masker and about –100 dB/octave are obtained for the lower edge steepness.

Between the level $L_M$ of the masking tone and the peaks of the masking thresholds $L_T$, a difference of about 12 dB is obtained which is distinctly greater than that with noise with critical bandwidth as masker. This is due to the fact that the intensities of the two sinusoidal tones of the masker and of the test tone at equal frequency are added, in contrast to noise and sinusoidal tone as test tone and thus lead to perception much earlier, that is to say at lower levels for the test tone. In addition, additional tones such as, for example, beats, which also lead to increased perceptibility or reduced masking, respectively, result with the simultaneous presentation of two sinusoidal tones.

Figure 8:
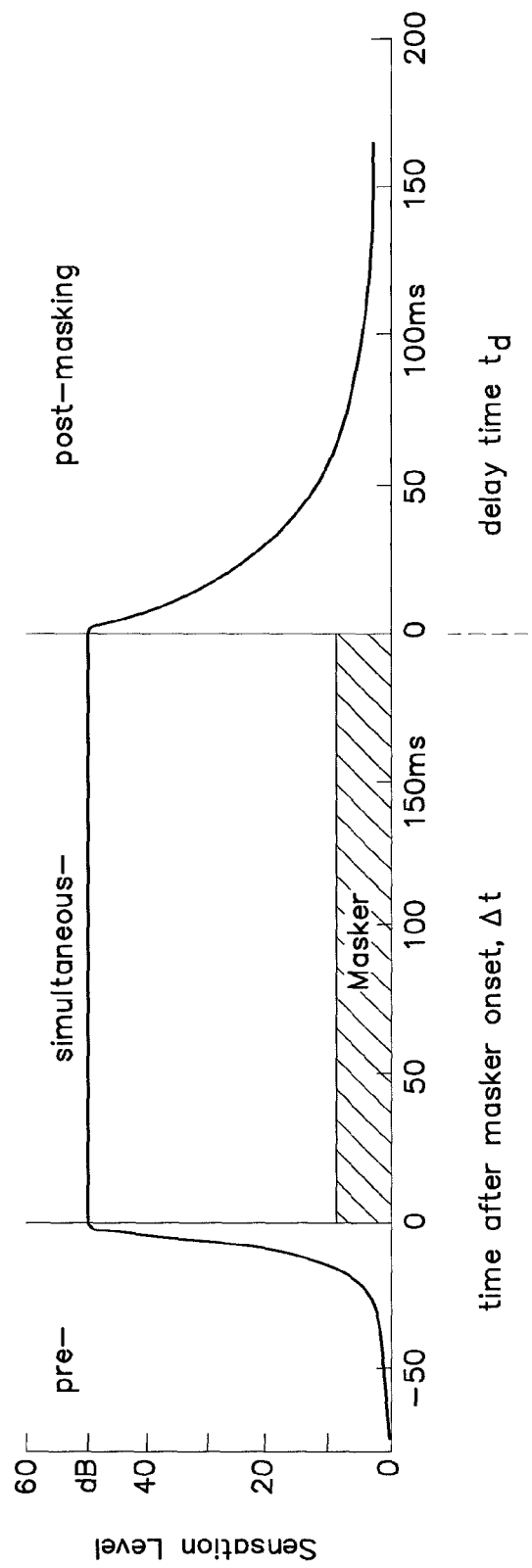
FIG. 8 is a diagram of simultaneous, pre- and post-masking.

Apart from the simultaneous masking described, there is a further psychoacoustic effect of masking, the so-called temporal masking. A distinction is made between two types of temporal masking. Pre-masking designates the circumstance that masking effects occur in the time even before a masker is switched on. Post-masking is the effect that after a masker is switched off, the masking threshold does not immediately drop to the threshold of audibility. Pre- and post-masking are shown diagrammatically in FIG. 8 and will be explained in greater detail below in conjunction with the masking effect of sound pulses.

To determine the effects of temporal pre- and post-masking, test tone pulses of short duration must be used in order to achieve the corresponding temporal resolution of the masking effects. Both the threshold of audibility and the masking threshold are dependent on the duration of a test tone. Furthermore, two different effects are known. These are the dependence of the loudness perception on the duration of a test pulse (see FIG. 9) and the relationship between the repetition rate of short tone pulses and the loudness perception (see FIG. 10). The sound level of a pulse of duration of 20 ms must be increased by 10 dB compared with the sound level of a pulse of duration 200 ms in order to trigger the identical sound intensity sensation. Above 200 ms pulse duration, the loudness of a tone pulse is independent of its duration. Processes with a duration of greater than about 200 ms represent steady-state processes for the human ear. Psychoacoustically verifiable effects of the time structure of sounds are present when these sounds are shorter than about 200 ms.

Figure 9:
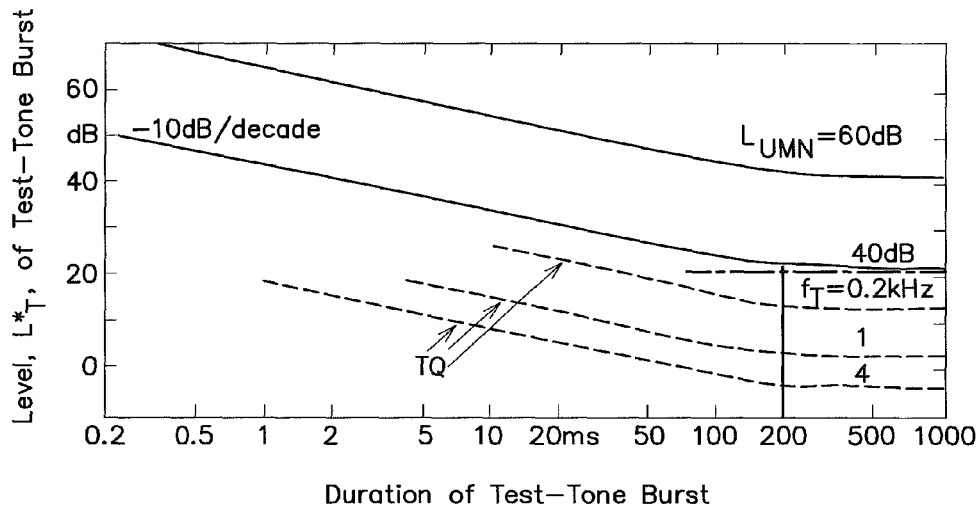
FIG. 9 is a diagram illustrating the dependence of the loudness perception on the duration of a test tone pulse.

FIG. 9 shows the dependence of the perception of a test tone pulse on its duration. The dotted lines designate the thresholds of audibility TQ of test tone pulses for the frequencies $f_T$=200 Hz, 1 kHz and 4 kHz in dependence on their duration, these thresholds of audibility rising at about 10 dB per decade for durations of the test tone of less than 200 ms. This behavior is independent of the frequency of the test tone, the absolute position of the courses for different frequencies $f_T$ of the test tone reflects the different thresholds of audibility at these different frequencies.

The continuous lines represent the masking thresholds when a test tone is masked by uniform masking noise with a level of $L_{UMN}$ of 40 dB and 60 dB, respectively. Uniform masking noise is defined such that it has a constant masking threshold within the entire hearing range, that is to say over all critical bands from 0 to 24 bark, thus the variations of the masking thresholds shown are independent of the frequency $f_T$ of the test tone. Just like the thresholds of audibility TQ, the masking thresholds also rise at about 10 dB per decade for durations of the test tone of less than 200 ms.

Figure 10:
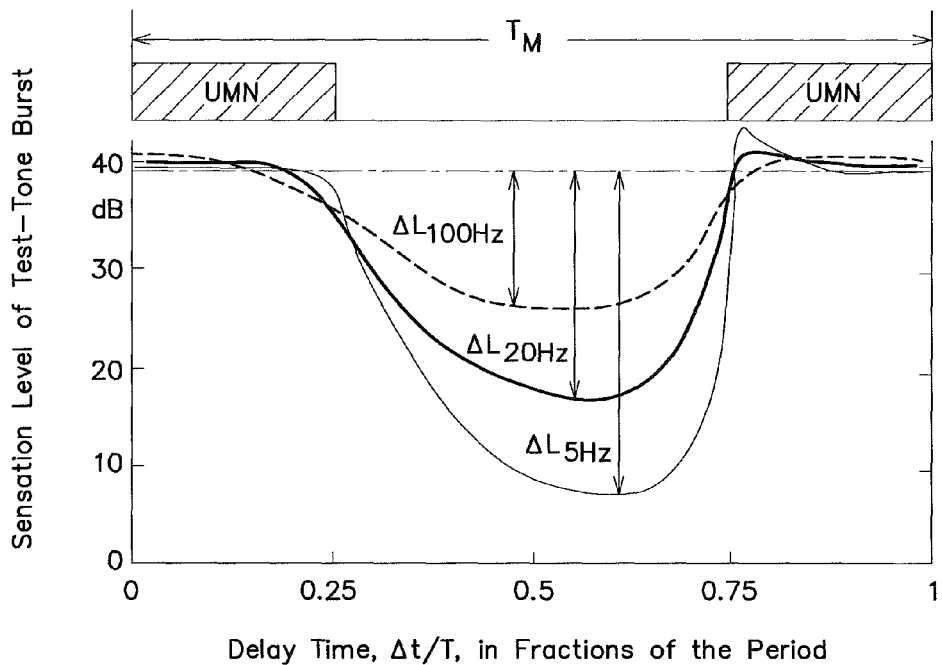
FIG. 10 is a diagram illustrating the dependence of the masking threshold on the repetition rate of a test tone pulse.

FIG. 10 shows the dependence of the masking threshold on the repetition rate of a test tone pulse of frequency 3 kHz and duration 3 ms. The masker is again uniform masking noise which is rectangularly modulated, e.g., periodically switched on and off. The investigated modulation frequencies of the uniform masking noise are 5 Hz, 20 Hz and 100 Hz. The test tone is presented with a repetition rate which is equal to the modulation frequency of the uniform masking noise, the position of the test tone pulse in time being correspondingly varied in the course of the performance of the test in order to obtain the time-dependent masking thresholds of the modulated noise.

Along the abscissa of FIG. 10, the displacement of the test tone pulse with time normalized to the period duration $T_M$ of the masker is shown and the ordinate shows the level of the test tone pulse at the masking threshold determined. The dot-dash line represents the masking threshold of the test tone pulse as reference point for an unmodulated masker, that is to say one that is continuously presented, of otherwise identical characteristics. The lesser edge steepness of the post-masking in comparison with the steepness of the edge of the pre-masking can again be seen clearly in FIG. 10. After the rectangularly modulated masker has been switched on, a short peak is produced from the masking threshold. This effect is called overshoot. The maximum decrease ΔL of the level of the masking threshold for modulated uniform masking noise in the pauses of the masker compared with the masking threshold for steady-state uniform masking noise decreases with increasing modulation frequency of the uniform masking noise, e.g., the variation with time of the masking threshold of the test tone pulse can drop less and less to the minimum value predetermined by the threshold of audibility.

It can again be seen from FIG. 10 that a masker already masks the test tone pulse before the masker is switched on at all. As already mentioned above, this effect is called pre-masking and is due to the circumstance that loud tones, e.g., tones with a high sound level are processed faster in time by the ear than quieter tones. The pre-masking effect is much less pronounced than the post-masking effect and is therefore frequently neglected in the application of psychoacoustic models in order to simplify the corresponding algorithms. After the masker has been switched off, the hearing threshold does not immediately drop to the threshold of audibility but only reaches it after a period of about 200 ms. The effect can be explained with the slow decay of the travelling wave on the basilar membrane of the inner ear. In the case of the present investigation and the method developed from it, this means that sound events masked in this manner, although they are physically present in an audio signal, do not contribute anything to the perceived auditory perspective and tonality of a sound environment with respect to their sound effect. In addition, the bandwidth of a masker also has a direct influence on the duration of the post-masking. In each separate critical band, the components of a masker falling into this critical band produce post-masking corresponding to FIG. 11 and FIG. 12.

Figure 11:
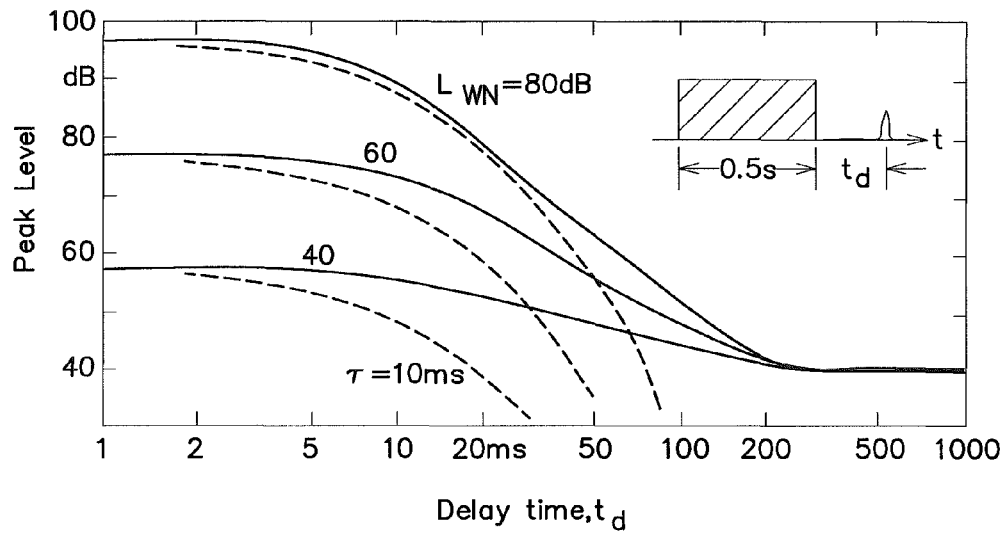
FIG. 11 is a diagram illustrating post-masking.

FIG. 11 illustrates the level variation $L_T$ of the masking threshold of a Gaussian pulse with a duration of 20 μs as test tone which is presented at time $t_d$ after the end of a rectangular masker of white noise with the duration of 500 ms, the sound level $L_{WR}$ of the white noise including the three levels 40 dB, 60 dB and 80 dB. The post-masking of the masker of white noise can be measured without spectral influences, since the Gaussian test tone of the short duration of 20 μs also exhibits a wide-band spectral distribution similar to white noise with reference to the perceptible frequency range of the human ear.

The continuous curves in FIG. 11 represent the courses of the post-masking obtained by measurement, which again reach the value for the threshold of audibility of the test tone, which is about 40 dB for the short test tone used here, after about 200 ms independently of the level $L_{WR}$ of the masker. Curves which correspond to an exponential decay of the post-masking with a time constant of 10 ms are shown dashed in FIG. 11. Such simple approximation can only be valid for large levels of the masker and in no case represents the course of the post-masking in the vicinity of the threshold of audibility.

Figure 12:
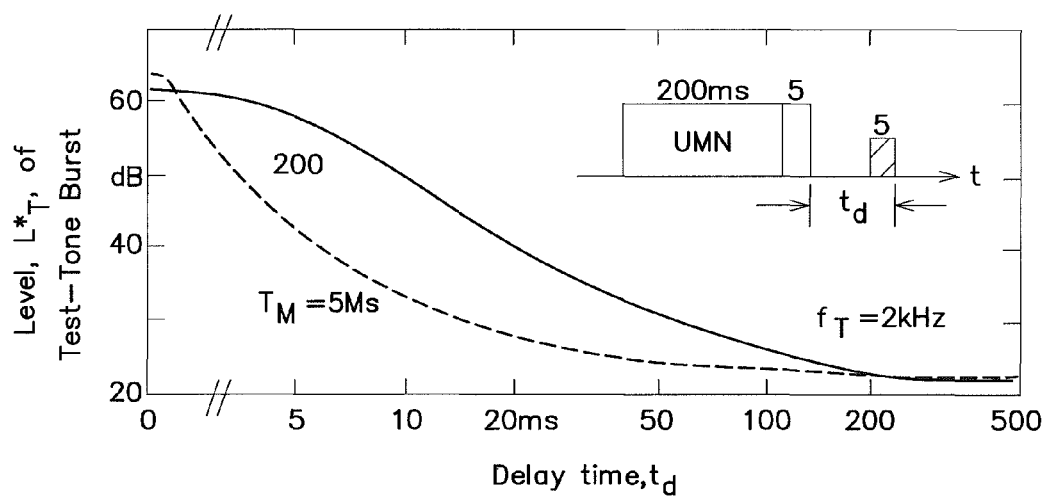
FIG. 12 is a diagram illustrating post-masking in dependence on the duration of the masker.

The post-masking is dependent on the duration of the masker. In FIG. 12, the masking threshold of a Gaussian test tone pulse of duration 5 ms and frequency $f_T$=2 kHz, as a function of the delay time $t_d$ after a rectangularly modulated masker including uniform masking noise with the sound level $L_{GVR}$=60 dB and duration $T_M$=5 ms has been switched off, is shown as a dotted line. The continuous line is the masking threshold for a masker of duration $T_M$=200 ms with otherwise identical parameters for test tone pulse and uniform masking noise.

The post-masking determined for the masker of duration $T_M$=200 ms corresponds to the post-maskings which are also found for all maskers of duration $T_M$ of greater than 200 ms with otherwise identical parameters. For maskers of shorter duration and otherwise identical parameters such as spectral composition and level, the effect of post-masking is reduced as can be seen from the variation of the masking threshold for a duration of $T_M$=5 ms of the masker. The utilization of the psychoacoustic masking effects in algorithms and methods such as the psychoacoustic model of masking also requires knowledge about what resultant masking is obtained in the case of composite, complex maskers or several individual maskers additively superimposed.

Simultaneous masking is present when a number of maskers occur simultaneously. Only few real sounds are comparable to a pure sound such as, for example, a sinusoidal tone. The tones of musical instruments but, for example, voice signals, too, are generally equipped with a relatively large number of harmonics. Depending on the composition of the levels of the partial tones, the resultant masking thresholds can be formed very differently.

Figure 13:
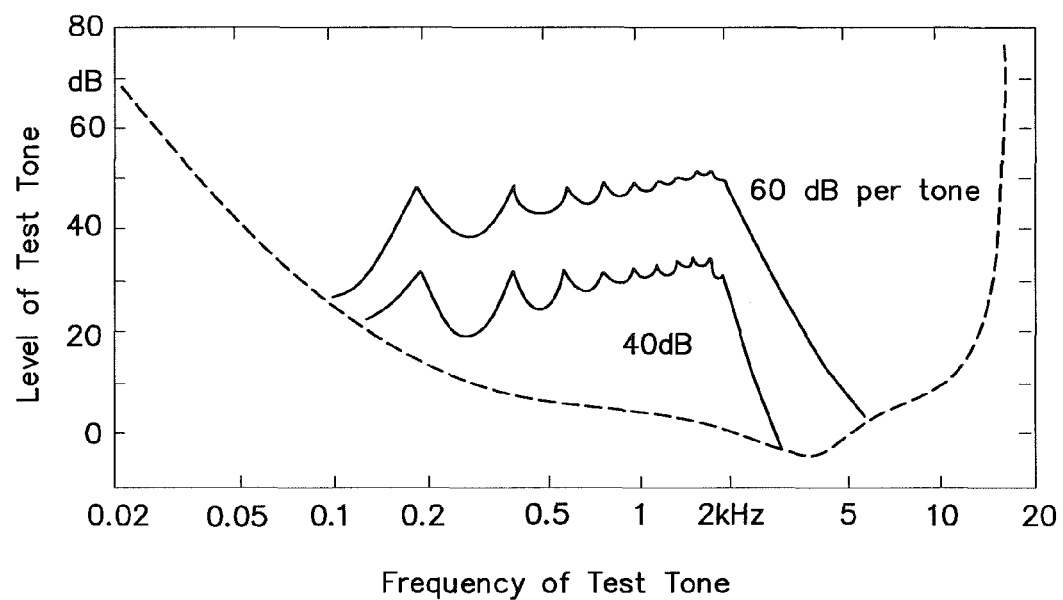
FIG. 13 is a diagram illustrating simultaneous masking by a complex tone.

FIG. 14 shows the simultaneous masking by a complex sound, i.e., the masking threshold for the simultaneous masking of a sinusoidal test tone by the ten harmonics of a sinusoidal tone of frequency 200 Hz in dependence on the frequency and the level of the excitation. All harmonics have the same sound level but are statistically distributed in their phase angle. FIG. 13 shows the resultant masking thresholds for two cases in which all levels of the partial tones in each case have 40 dB and 60 dB, respectively. The fundamental tone and the first four harmonics are each separated in different critical bands. There is thus no additive superimposition of the masking components of these components of the complex sound for the peaks of the masking threshold.

However, the overlap of the upper and lower edges and the resultant dip from the addition of the masking effects, which is still clearly above the threshold of audibility even at its lowest point, can be clearly seen. The upper harmonics, in contrast, are increasingly located within a critical band of the human ear. In this critical band, there is clearly a strong additive superimposition of the individual masking thresholds. As a consequence, the addition of simultaneous maskers cannot be calculated by adding their intensities but, instead, must be obtained by adding the individual specific loudnesses in order to describe the psychoacoustic model of the masking.

To form the distribution of excitation from the sound signal spectrum of time-variant signals, the variation of the masking thresholds of sinusoidal tones, known for this case, is used as a basis in masking by narrow-band noise. A distinction is made between core excitation (within a critical band) and edge excitation (outside a critical band). For example, the psychoacoustic core excitation of a sinusoidal tone or of narrow-band noise with a bandwidth of less than the critical bandwidth is equal to the physical sound intensity. Otherwise, a corresponding distribution to the critical bands covered by the sound spectrum takes place. From the physical intensity density spectrum of the incoming time-variant noise, the distribution of the psychoacoustic excitation is thus formed. The distribution of psychoacoustic excitation is called specific loudness. In the case of complex sound signals, the resultant total loudness is the integral over the specific loudness of all psychoacoustic excitations within hearing range along the critical-band range scale, that is to say in the range from 0 to 24 bark, and also exhibits a corresponding variation with time. From this total loudness, the masking threshold is then formed via the known relationship between loudness and masking, this masking threshold decaying to the threshold of audibility within about 200 ms after the end of the sound within the respective critical band, taking into consideration time effects (see also FIG. 11, post-masking).

In this manner, the psychoacoustic model of masking used herein is achieved by taking into consideration some or all effects of masking discussed above. From the preceding figures and explanations it can be seen what masking effects are produced by sound levels, spectral composition and variation with time of sound signals presented and how these can be utilized for deriving the necessary parameters for adjusting the physical quantities in the tuning of a sound system. The aim is to reduce the expenditure, for example for reducing reverberation times, to the extent that is necessary for the human ear due to the masking effects. Due to the physiology of the basilar membrane of the inner ear, described above, the post-masking described takes place over a relatively long period at low frequencies and decreases increasingly towards higher frequencies. The question with respect to the different effect of reverberation, raised above, can also be answered with the psychoacoustic effect of frequency-dependence of the post-masking. In the further course, the knowledge of masking is also used for defining suitable specifications for performing an at least partially automated tuning of sound systems in motor vehicles.

Furthermore, the dependence of the tonality on the degree of modulation was also investigated. The degree of modulation is here the fluctuation of amplitude of the direct sound over frequency. If the degree of modulation is small, that is to say if the difference in amplitude over frequency is small, there is also only little discoloration of the useful signal and, in consequence, the tonality is also improved since the sound offered via the sound system provides a much more natural sound impression. As mentioned above, further findings relating to this can be obtained from the impulse response, especially with respect to the dynamic behavior, with the aid of the analysis method according to Liberatore et al., some of which are shown in the text which follows.

FIGS. 14A-14D show the variation with time of sinusoidal pulses transmitted by the sound system at a fixed frequency of 500 Hz. FIG. 14 comprises the representation of the measured sinusoidal pulses for the cases of the untuned sound system (linear set, FIG. 14A), the sound system tuned with regard to phase (delay set, FIG. 14B), the sound system additionally tuned with regard to amplitude response (filter set, FIG. 14C) and the sound system completely tuned in the iterative method (tuning set, FIG. 14D). The abscissa of the four representations according to FIGS. 14A-14D in each case designates the time in ms and the ordinate of the four representations according to FIGS. 14A-14D in each case designates the measured amplitude in linear representation. The areas during the presentation of the sinusoidal pulse and after the sinusoidal pulse has been switched off (decay behavior) after a time of about 320 ms can be clearly distinguished.

Figure 14A:
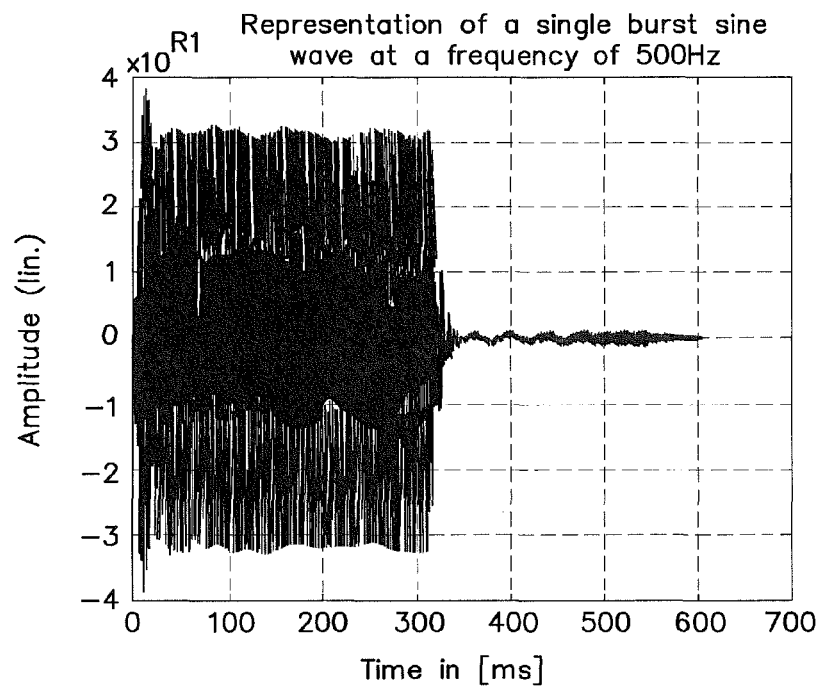
FIGS. 14A-14D illustrate the behavior of sinusoidal pulses transmitted by a sound system.
Figure 14B:
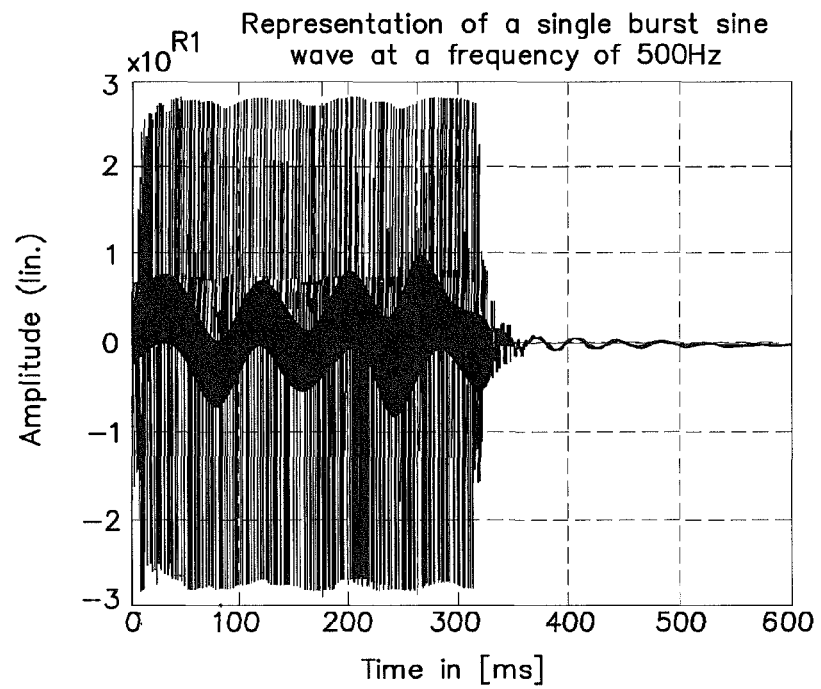

From FIG. 14B, it can be seen in the representation at the top right that the delay tuning primarily improves the response characteristic and the decay characteristic in comparison with linear tuning to the extent that the decay characteristic is asymptotic and has almost no more higher-frequency components as required. In addition, no further overshot can be seen in the response characteristic in comparison with linear tuning (FIG. 14A). This overshot shortly after the beginning of the sinusoidal pulse in linear tuning is due to the fact that first the direct sound is present and then the first reflections lead to a destructive interference (partial extinction). As a result, the amplitude very rapidly drops to a lower value than the maximum possible value shortly after the beginning of the sinusoidal pulse.

Figure 14C:
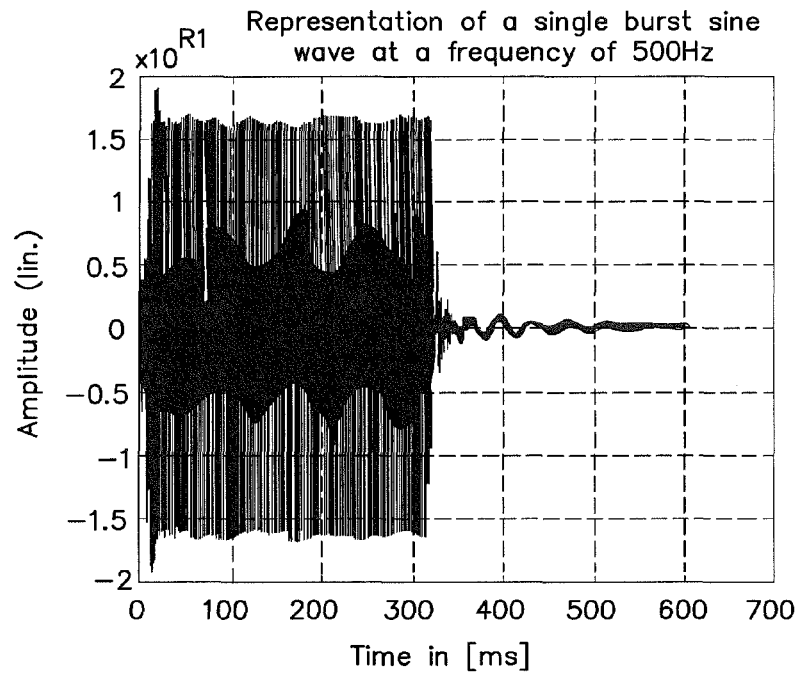
Figure 14D:
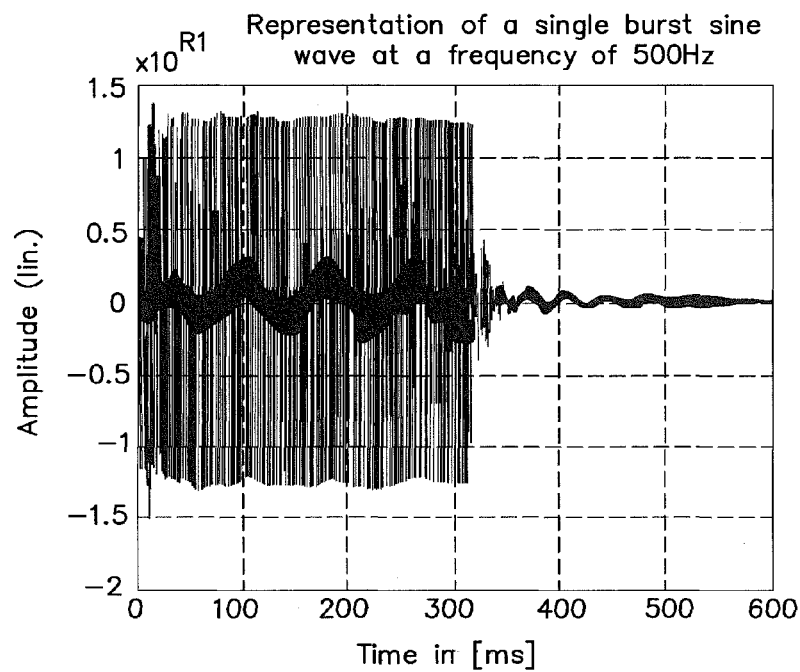

In comparison with linear tuning, the tuning of the amplitude response according to FIG. 14C, leads to a reduction in the degree of modulation during the steady-state settled state of the sinusoidal pulse. In contrast to the results after the delay tuning according to FIG. 14B, the response and decay characteristics are only insignificantly improved in comparison with the linear tuning according to FIG. 14A. After completed iterative tuning of the sound system, the non-ideal compromise between delay tuning (phase) and tuning of the amplitude response (equalizing), previously discussed, can again be seen (see FIG. 14D). In comparison with the linear tuning (FIG. 14A), the degree of modulation is distinctly reduced but the response and decay characteristic is scarcely or only moderately improved.

FIGS. 15A-15D show the variation with time of spectrograms which were obtained by corresponding analysis from the variations with time of the sinusoidal pulses according to FIGS. 14A-14D. FIGS. 15A-15D comprise the representation of the spectrograms of the sinusoidal pulses measured in the internal space of the vehicle and reproduced by the sound system for the cases of the untuned sound system (linear set, FIG. 15A), the sound system tuned with regard to phase (delay set, FIG. 15B), the sound system additionally tuned with regard to amplitude response (filter set, FIG. 15C) and the sound system completely tuned in the iterative method (tuning set, FIG. 15D). The time is again plotted in ms along the abscissa of all four representations according to FIGS. 15A-15D and the ordinate of the four representations according to FIGS. 15A-15D designate the frequency in Hz in linear scaling. Areas HL designate high measured sound pressure levels (see distinct amplitude at 500 Hz for the period of about 320 ms) and areas LL again designate low measured sound pressure levels.

Figure 15A:
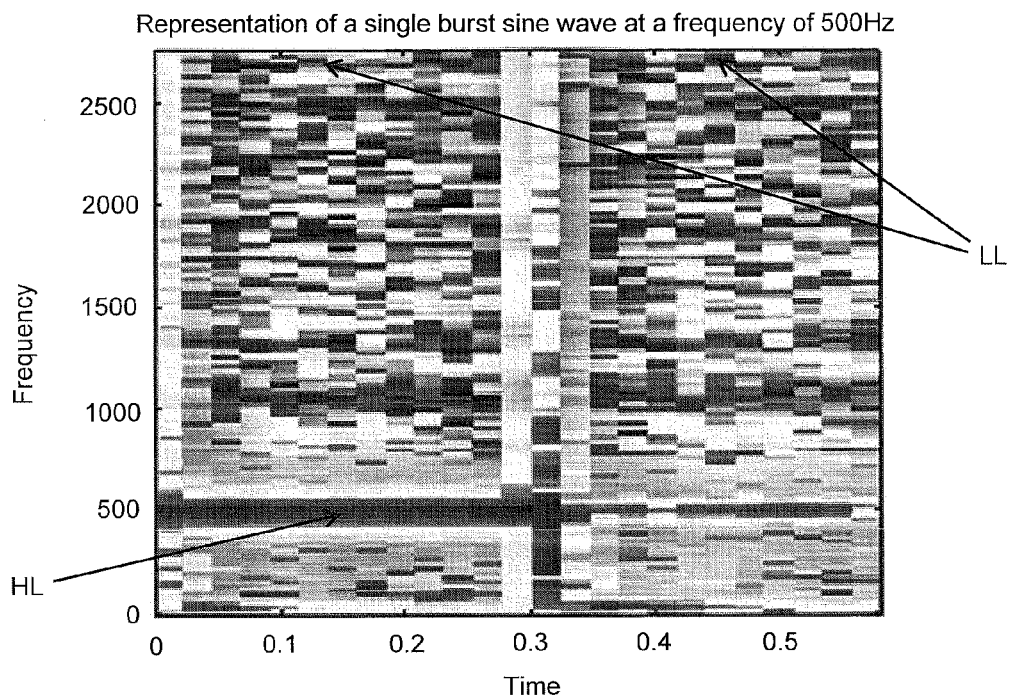
FIGS. 15A-15D are spectrograms of sinusoidal pulses according to the linear-, delay-, filter-, and tuning-set, respectively.
Figure 15B:
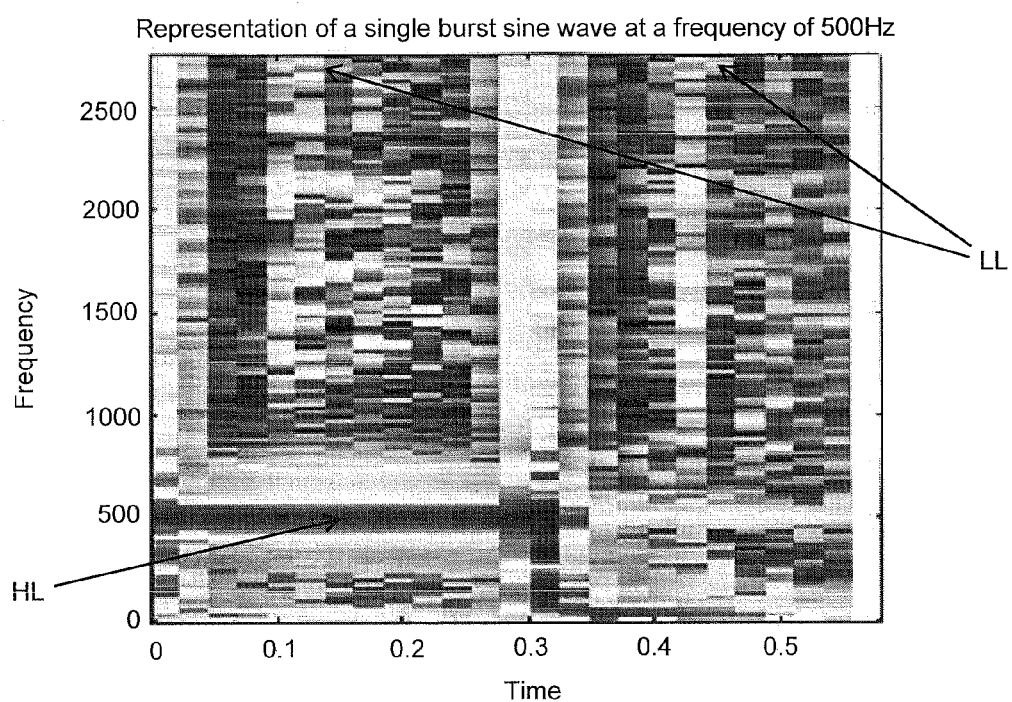
Figure 15C:
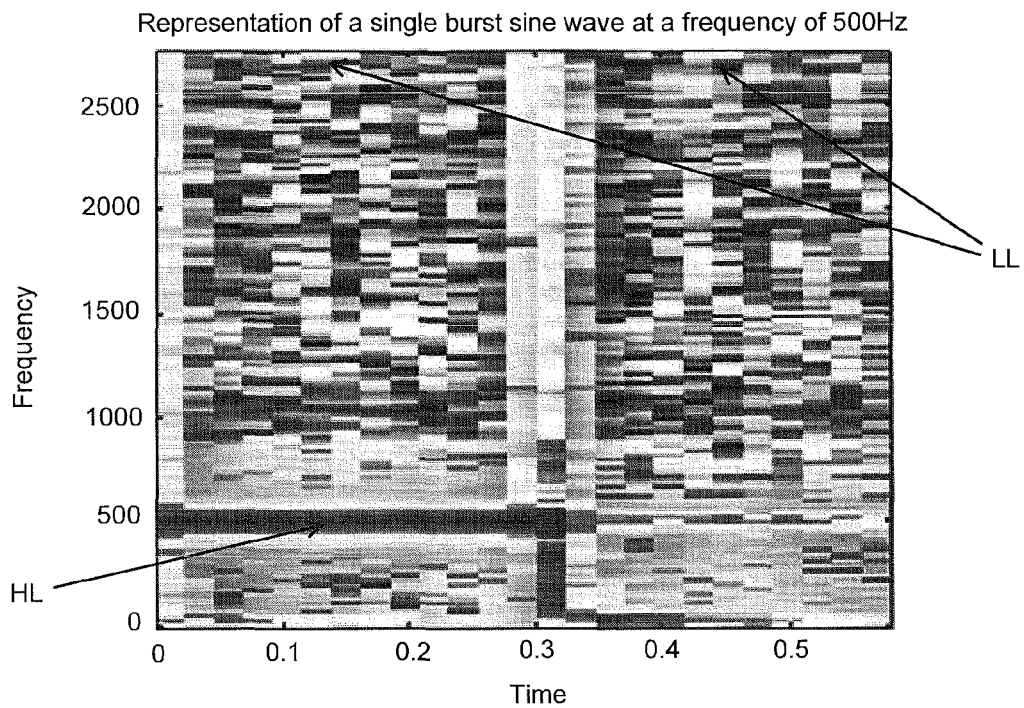
Figure 15D:
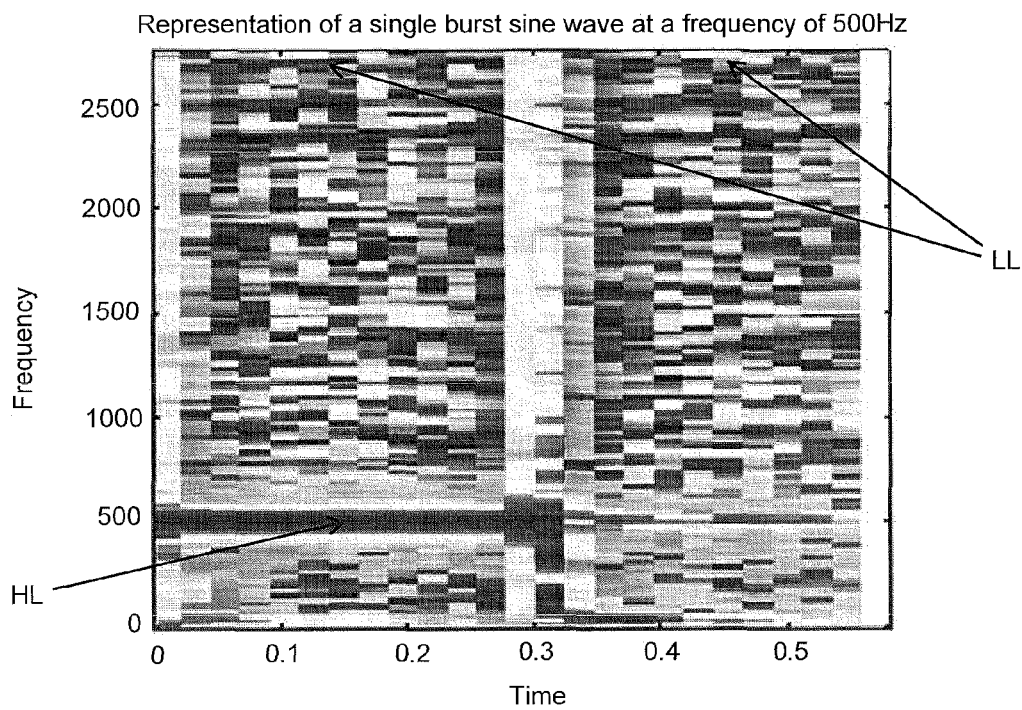

The degree of modulation previously discussed can only be seen inadequately in this type of representation, but the effects of the tuning of the phase (delay set) can be seen very clearly. As can be seen on the uniform variation of level in FIG. 15B (delay set), tuning of the phase, apart from the very clear fundamental frequency of 500 Hz, leads to a very uniform distribution of the frequency components in the spectrum of the sinusoidal pulse in comparison with linear tuning (FIG. 15A). This means that, differently from the linear tuning, no pronounced peaks which would indicate a strong degree of modulation occur in any of the considered frequency ranges after the delay tuning. It was also found that, taking into consideration the findings from psychoacoustics, it is of advantage if, when carrying out equalizing, reference is made to the peaks in the variation with time of the sinusoidal pulses and not to their steady-state final value or their absolute value average, respectively.

FIGS. 16A-16D shows the transfer function of the sound system investigated which was in each case determined with 500 sinusoidal pulses, which were distributed in frequency over the frequency range measured, the frequency range measured being restricted again to the area which is determined for the auditory sensations of auditory perspective and tonality (up to slightly above 2 kHz in the present case). In the representations of FIGS. 16A-16D, the frequency of the sinusoidal pulses used is in each case plotted in logarithmic representation along the abscissa and the associated amplitude in dB, determined at the measuring site, is plotted along the ordinate. Furthermore, three different evaluations of the measured amplitudes were performed in this measurement series in order to obtain the three transfer functions shown in each case in the four diagrams of FIGS. 16A-16D. These are the absolute mean value of the sinusoidal pulses (see pulse mean value, LL curves in FIGS. 16A-16D), formed over the duration of the sinusoidal pulses presented the above-mentioned peak value of the sinusoidal pulses presented (see pulse peak value, HL curves in FIGS. 16A-16D), and the respective level values which are determined at a time of 25 ms after the sinusoidal pulses have been switched off (see pulse decay value after 25 ms, curves TL in FIGS. 16A-16D). For the calculation of the mean the whole length of the pulse is used which is about 320 ms. This pulse decay value after 25 ms represents a measure of the decay behavior of the sound system at this time which was excited by sinusoidal pulses. FIGS. 16A-16D again comprises the representation of the transfer functions of the sinusoidal pulses measured in the internal space of the vehicle and reproduced by the sound system for the cases of the untuned sound system (linear set, FIG. 16A), the sound system tuned with regard to phase (delay set, FIG. 16B), the sound system additionally tuned with regard to amplitude response (filter set, FIG. 16C) and the sound system completely tuned in the iterative method (tuning set, FIG. 16D). The abscissas of the four representations according to FIGS. 16A-16D in each case designate the frequency of the sinusoidal pulses in Hz in logarithmic scaling, the ordinates of the four representations according to FIGS. 16A-16D designate the level in dB measured in each case.

As can be seen from FIGS. 16A-16D, the curves of the measured peak values of the sinusoidal pulses presented (see pulse peak value, curves HL in FIGS. 16A-16D) and the curves of the level values determined at a time of 25 ms after the sinusoidal pulses have been switched off (see pulse decay value after 25 ms, curves TL in FIGS. 16A-16D) in each case exhibit a very much more similar variation over frequency in all four variants of tuning of the sound system than the curves of the absolute mean values of the sinusoidal pulses (see pulse mean value, curves LL in FIGS. 16A-16D) formed over the duration of the sinusoidal pulses presented and the curves of the level values determined at a time of 25 ms after the sinusoidal pulses have been switched off. For this reason, the difference of pulse decay value after 25 ms (decay behavior) and pulse peak value (peak values of the sinusoidal pulses) were in each case formed. The main reason to use especially those responses to form the difference is based on the fact, that the peak as well as the decay responses correspond to a far greater extent to the transition behavior of the speaker and less to the properties of the specific room and can such be more accurately compared with each other. The respective resultant results are shown in FIGS. 16A-16D by the curves ML (see difference peak versus decay in FIGS. 16A-16D). The black straight line in the diagrams of FIGS. 16A-16D represents a difference of −12 dB as reference point.

Figure 16A:
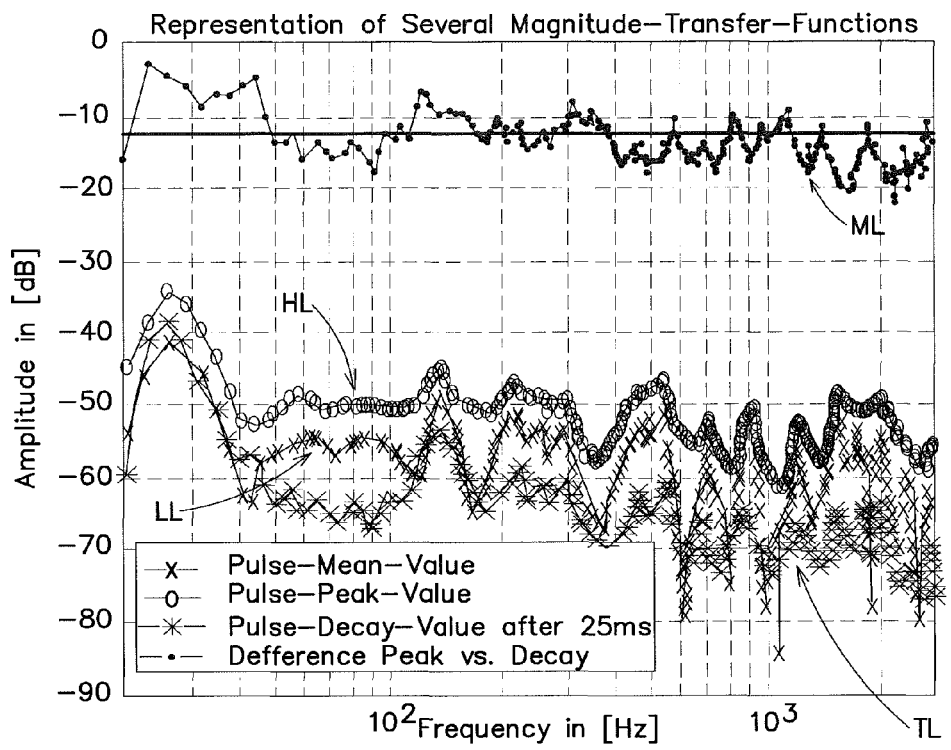
FIGS. 16A-16D are graphs illustrating the transfer functions determined from a number of sinusoidal pulses each according to the linear-, delay-, filter- and tuning-set, respectively.
Figure 16B:
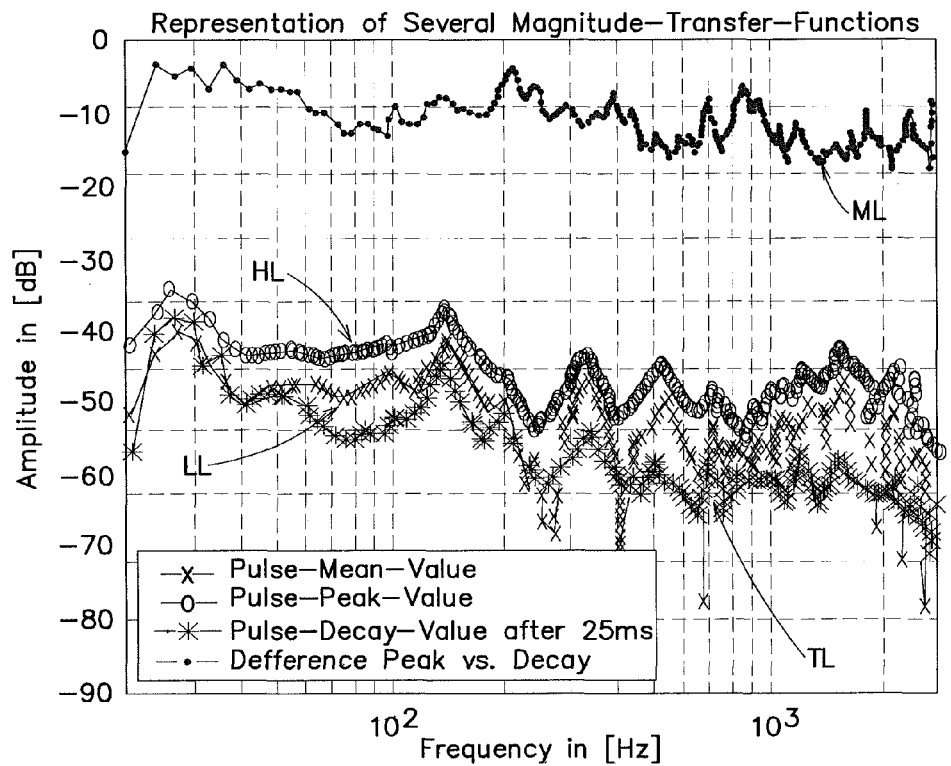
Figure 16C:
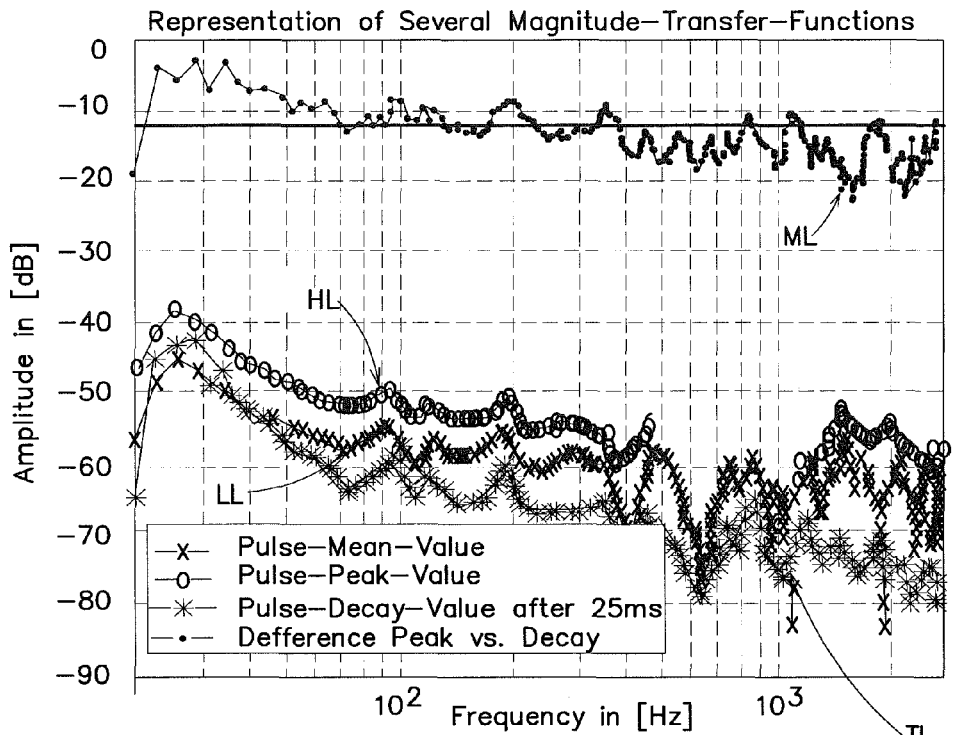
Figure 16D:
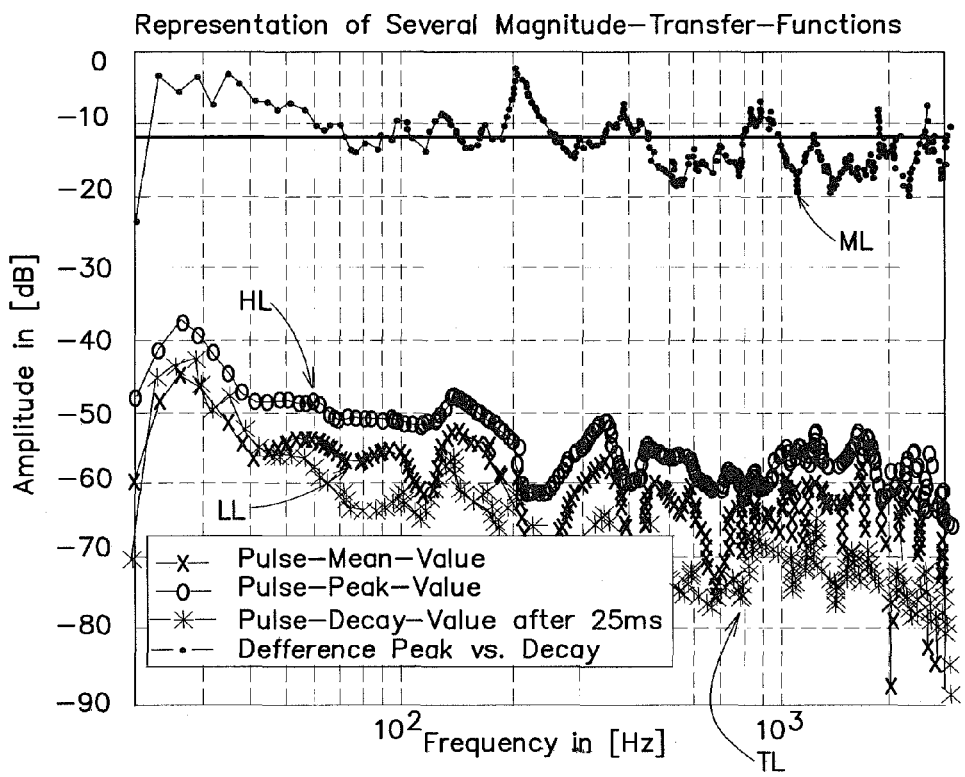

Referring to FIG. 16C, i.e., the impulse response of the sound system with the pure filter set (sound system tuned with regard to amplitude response), it can be seen from the curves of pulse mean value, pulse peak value and pulse decay value after 25 ms what qualitative variation a target function should have for equalizing in the internal space of the vehicle examined. The equalizing of sound systems in motor vehicles, performed by acoustic experts, is in no way flat with regard to the frequency response but exhibits an overshoot in the low-frequency areas which becomes less and less with increasing frequency. In the example in the above diagram, the transition to a flat curve occurs at about f=500 Hz. In this manner, the measurement results achieved indicate how the amplitude response is to be equalized, for example in an automated method, in order to take into consideration the psychoacoustic features of this equalizing which, of course, have been implicitly introduced by the acoustic experts during the manual tuning of the sound system by achieving the optimum auditory impression with regard to auditory perspective and tonality.

Apart from evaluating the amplitude response in such a manner that only the psychoacoustically relevant changes are derived in the tuning of the sound system, there is another option for extracting or deriving psychoacoustically relevant features for equalizing sound systems from the measured impulse response. For example, a psychoacoustic model according to Johnston may be used to infer from it the necessary equalizing. The Johnston model comprises four essential part-steps:

1. Determining the masking threshold of a sequence of white noise signals;
2. Filtering this sequence of white noise with the measured impulse response;
3. Determining the masking threshold of the filtered sequence of white noise;
4. Determining the difference between the two masking thresholds from steps 1 and 3.

The level of the white noise measurement signal is not so important, but a typical playback level of approximately 80 dB SPL would be beneficial.

The difference between the two masking thresholds from 1 and 3 determined in step 4, can be considered as a target function, derived on the basis of psychoacoustic principles, for adjusting the equalizers of the sound system since it is based on the masking effects of a wide-band signal (white noise). White noise, in good approximation, represents a wide-band signal as is present, for example, with the audio presentation of music over the sound system.

Figure 17:
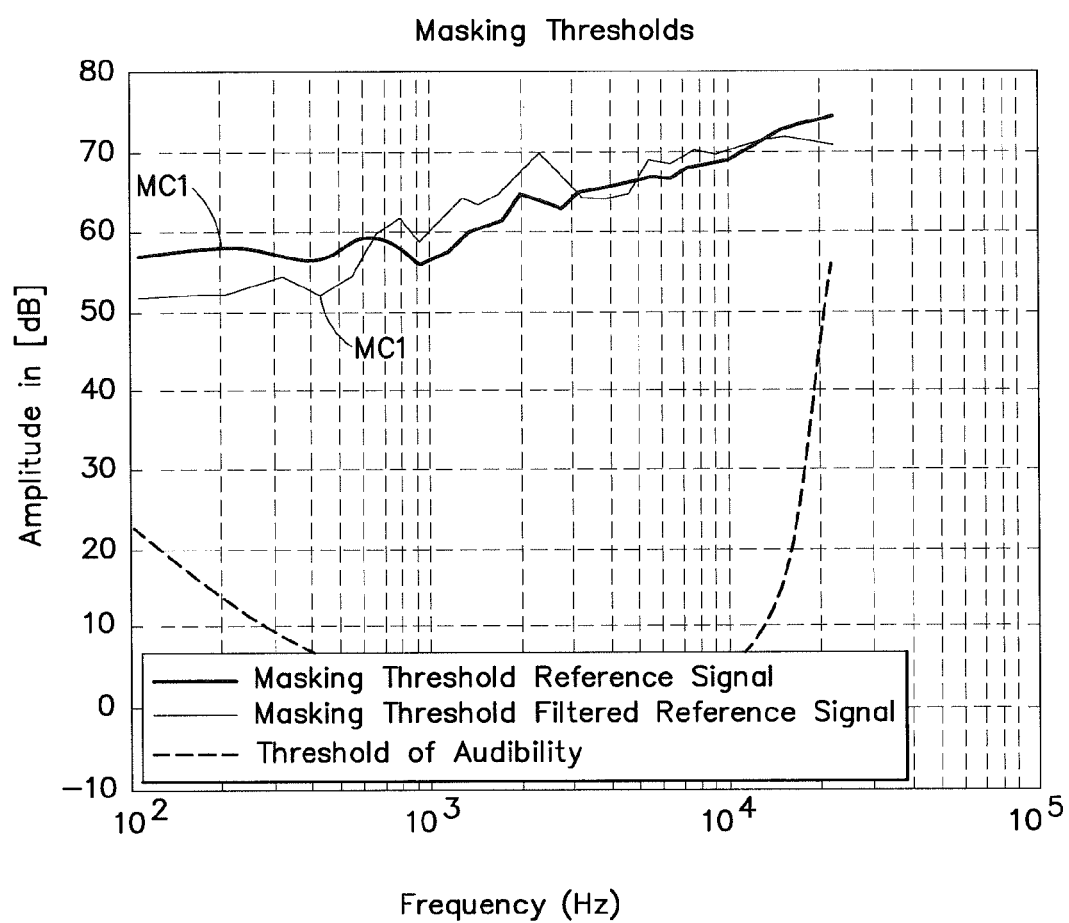
FIG. 17 is a graph illustrating the masking thresholds of white noise and filtered white noise.

FIG. 17 shows the simulated masking threshold determined of the reference signal (unfiltered white noise, step 1, masking curve marked with MC1), the masking threshold determined (step 3) of the signal filtered with the impulse response of the sound system in step 2 (masking curve MC2) and, indicated as a dotted line, the variation of the threshold of audibility (see above with respect to the statements of psychoacoustic masking effects). The frequency is plotted in logarithmic representation along the abscissa in FIG. 17, the ordinate of FIG. 17 designates the level of the thresholds determined in dB.

Figure 18:
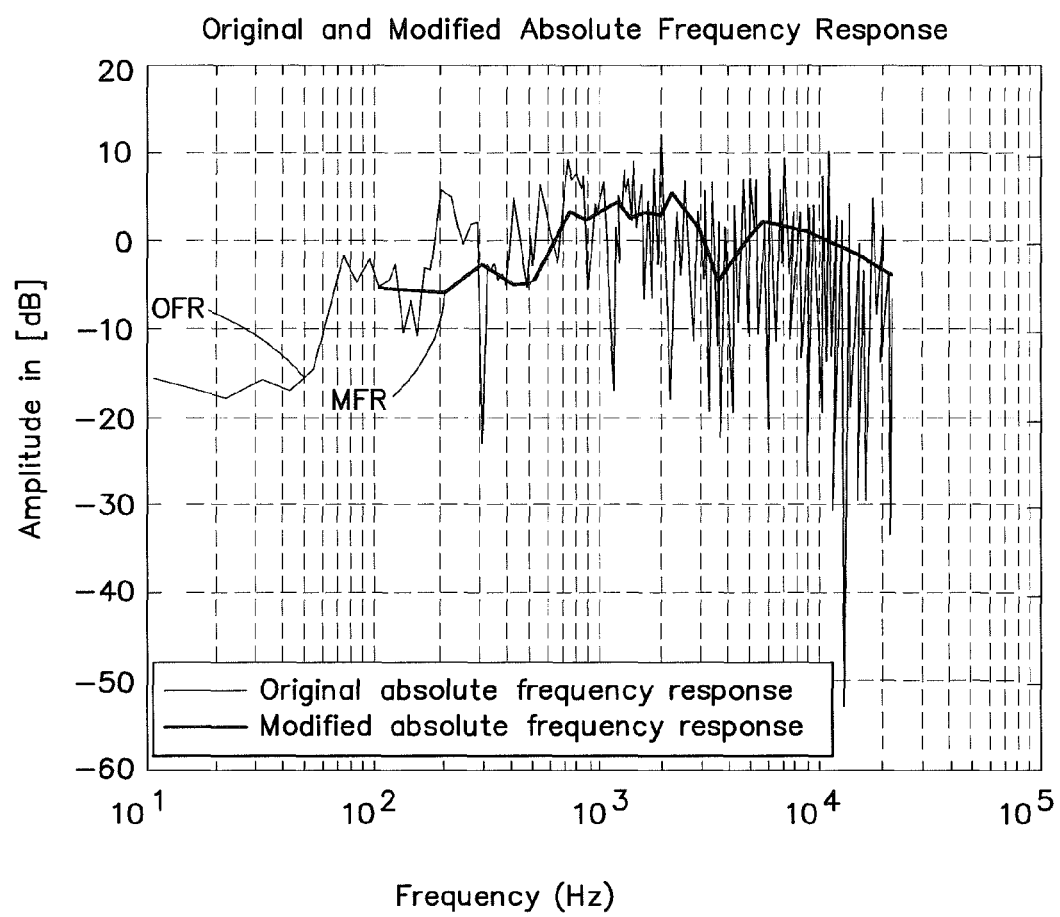
FIG. 18 is a graph illustrating the frequency response of a sound system in comparison with the frequency response determined with the so-called Johnston method.

FIG. 18 shows the original amplitude response OFR of the sound system and, in comparison, the variation of the modified amplitude response MFR determined with the aid of the psychoacoustic method according to Johnston. That is, the curve denoted as "original magnitude frequency response" shows the magnitude frequency response of the originally measured impulse response within the interior of the automobile cabinet, whereas the curve denoted as "modified magnitude frequency response" shows its corresponding absolute masking threshold, delivered by the Johnston masking model. The frequency is plotted in logarithmic representation along the abscissa in FIG. 18 and the ordinate of FIG. 18 designates the level in dB.

Figure 19:
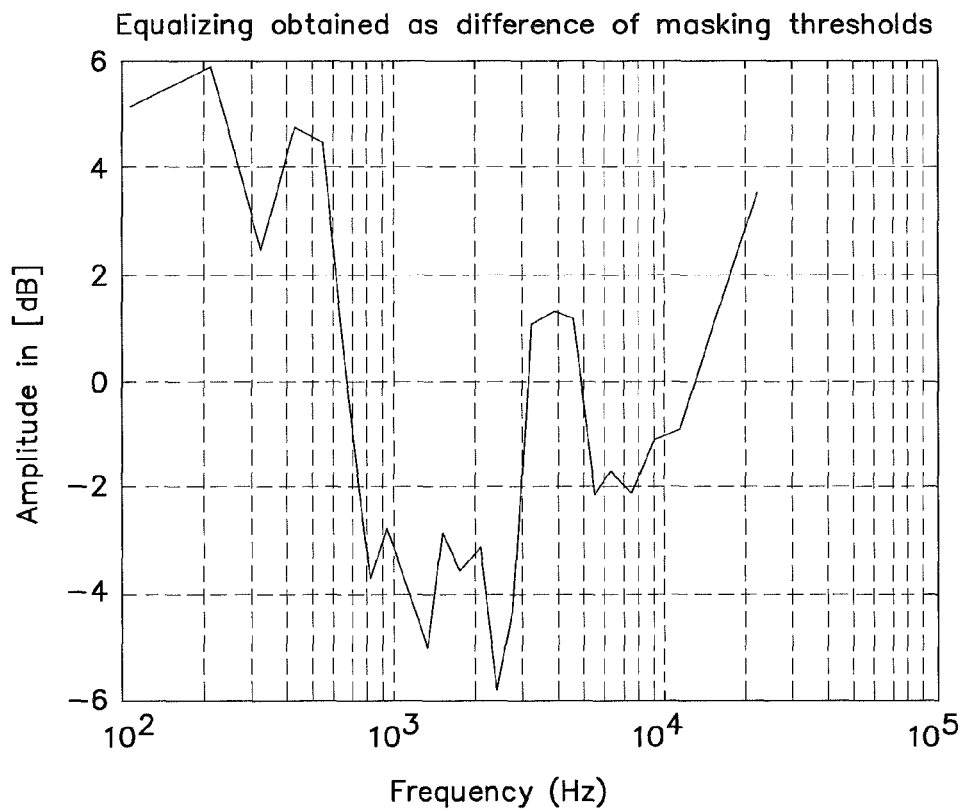
FIG. 19 is a graph illustrating equalizing according to the Johnston method based on the difference of two masking thresholds determined with filtered and unfiltered white noise.

FIG. 19 illustrates the course of equalizing obtained from the Johnston method by the difference of the two masking thresholds of the filtered and unfiltered white noise which have been determined. The frequency is again plotted in logarithmic representation along the abscissa of FIG. 19, the ordinate of FIG. 19 designates the level in dB. Looking at FIGS. 17 to 19 together, it can be seen that a measure for equalizing sound systems which is also orientated towards psychoacoustic features of the auditory sensation (e.g., masking thresholds) can also be determined by the Johnston method.

In the course of the investigations, a further interesting procedure of the acousticians when performing the tuning of sound systems has been found. In their manual tuning of sound systems, the performing acousticians frequently additionally or exclusively set a tuning point for the equalizing at those frequencies at which the space to be tuned (the interior of a vehicle in this case) exhibits an overshot in the amplitude response, but also at a frequency which is mostly slightly higher. This can again be explained with the psychoacoustic effects of masking. Accordingly, the masking thresholds of sound events drop more shallowly towards higher frequencies than towards low frequencies. In consequence, the masking caused, for example, by resonances in the space to be tuned, is also more pronounced over a greater range towards higher frequencies than in the direction of the lower frequencies starting from the center frequency of the respective level overshot. Therefore, the filters used for equalizing should also ideally not have a bell-shaped attenuation curve as is the case in the equalizing (EQ), bandpass (BP) or bandstop (BS) filters used commonly. For this reason, the use of so-called gamma tone filters is recommended for the auditorily correct filtering of the signals (see, for example, B. Moore, B. Glasberg, "Suggested formulae for calculating auditory filter bandwidths and excitation patterns", Journal of the Acoustical Society of America, 74: 750-753, 1983; and Roy D. Patterson, John Holds-worth, "A Functional Model of Neural Activity Patterns and Auditory Images", Advances in Speech, Hearing and Language Processing, Vol. 3, JAI Press, London, 1991).

These auditorily correct gamma tone filters are used for simulating the response of the basilar membrane of the human inner ear to sound events. Taking into consideration the masking effects in the frequency domain, described above, one arrives at critical bandwidths (CB) or critical bands (see Bark scale) which are also called equivalent rectangular bandwidths (ERB) with respect to gamma tone filters. The distribution density of these hearing-corrected filters is described by a function which is essentially linear up to 500 Hz and then logarithmic towards higher frequencies (see Bark scale). The ERB bandwidth can be calculated as the function of the center frequency $f_c$ in Hz, as:

ERB=24.7+0.108·$f_c$

The filters of a filter bank formed from gamma tone filters are based on the so-called gamma tone function which can be described by:

$g(t) = at^{n-1} \cdot e^{-2\pi b(f_c) \cdot t} \cdot \cos(2\pi f_c t + \Phi)$ where $at^{n-1}$ designates the starting value of the impulse response, $b(f_c)$ designates the bandwidth ERB in Hz at the center frequency $f_c$, and $\Phi$ designates the phase.

The investigations outlined above have been directed to how objective criteria and procedures, which possibly are capable of being automated, can be derived from the work of experienced acousticians and sound engineers in the tuning of sound systems in motor vehicles. As a result, it was found that a certain order in changing the parameters for the tuning of sound systems is found to be useful, namely tuning in the order of cross-over filter, delay lines (phase) and equalizing of the amplitude response. In addition, it was found that different, frequency-dependent decay time constants such as can be seen, for example, from the energy decay curves, may provide information on the acoustic quality of a tuning performed. Furthermore, the influence of different phase responses both on the direct sound and on the frequency-dependent decay behavior after the direct sound has ended was demonstrated by the measurements and analyses performed.

On the basis of the results found, the tuning of the amplitude response is implemented with zero-phase or linear-phase filters so that a result of the phase tuning previously achieved, and thus the spatial imaging and the staging of the audio signals reproduced over the tuned sound system, remain independent and uninfluenced by subsequent tuning of the amplitude response. In the following investigations, it has been checked whether the use of linear-phase filters for equalizing the amplitude response really improves the acoustic imaging. In this context, FIR filters are typically used as linear-phase filters. FIR filters have a finite impulse response and operate in discrete time steps which are usually determined by the sampling frequency of an analogue signal. An N-th order FIR filter is described by the following differential equation:

$$Y(n) = b_0 * x(n) + b_1 * x(n-1) + b_2 *$$
$$x(n-2) + \ldots + b_N * x(n-N)$$
$$= \sum_{i=0}^{N} b_i * x(n-i)$$

where y(n) is the output value at time n and is calculated from the sum, weighted with the filter coefficients $b_i$ of the N last sampled input values x(n–N) to x(n). The required transfer function is achieved by specifying the filter coefficients $b_i$.

To assess what influence equalizing performed with linear-phase filters has on acoustics and sound effect, equalizing performed with conventional biquad filters, which also influences the phase in an unintended manner, was replaced in a sound system tuned in an conventional manner (in the order of cross-over filter, phase delay lines, equalizer for the amplitude response) by linear-phase equalizing which leaves the tuned phase unchanged and only modifies the amplitude response as required. The results of this test, determined by hearing tests, quite clearly show that, with respect to the spatial resolution of the sound effect, equalizing by using linear-phase filters is superior to conventional equalizing which is typically performed with biquad filters.

The distinction was also perceptible without problems in an A/B comparison by a group of test subjects without special acoustic training who graded themselves as non-audiophiles, that is to say the sound effect of a sound system tuned in its amplitude response with the aid of linear-phase filters was judged to be more positive than the conventional biquad based magnitude-tuning. To keep in mind the comparability in these investigations, attention had to be paid to the fact that the equalizing performed in each case resulted in precisely the same amplitude response and it must be assumed, as described above, that the phase influence in equalizing with biquad filters leads to a certain displacement of the acoustic pole positions and nulls and this property is intuitively taken into consideration by acousticians when tuning a sound system.

It can be concluded from this that equalizing which is performed independently of the boundary conditions of an A/B comparison after tuning the phases with linear-phases filters can partly lead to other results in the amplitude response and presumably to an even better result in the sound effect achieved. However, this assumption can only be finally judged when using a real-time tuning tool which enables such equalizing to be performed with adequate accuracy of representation and with an adequate number of output channels.

During the investigations, the question has arisen, whether in the phase tuning and the associated interaction between cross-over filters and delay lines, it is primarily the frequency-selective effect, the phase response or both criteria together which have the greatest significance in the design of the cross-over filters. To investigate the influence of linear-phase cross-over filters on the acoustic sound effect, all cross-over filters which originally were also implemented conventionally with the aid of cascaded biquad filters were then also replaced hereinafter by linear-phase FIR filters, in addition to the filters used for equalizing the amplitude response. It was intended to find out whether their frequency-selective effect, in conjunction with their respective phase responses, leads to an improvement in the spatial imaging or only one of the two characteristics is responsible for the increase in spatial resolution.

Differently from what was initially assumed, it has been found that a linear-phase embodiment of the cross-over filters, in comparison with the arrangement as minimum-phase cross-over filters (for example biquad filters), can also achieve an improvement in the acoustic sound effect in hearing tests. At the same time, the "uncontrollable" phase response of conventional cross-over filters (for example biquad filters) leads to an acoustic impairment of the sound effect of sound systems in motor vehicles even if this positive effect is less in this case than was the case when the conventional filters were replaced by linear-phase filters in the case of equalizing the amplitude responses.

A current practice in the tuning of sound systems is represented by a step-by-step adjustment where first the cross-over filters of the sound system, then the delay lines and then the filters for actually equalizing the amplitude response are to be adjusted. To achieve the desired result, it is necessary to iterate again and again between the individual stages after each adjustment of a stage in the manual tuning process in order to achieve the optimum sound effect for the specific vehicle or its sound system, respectively, and the acoustic characteristics of the passenger space. This iterative process is difficult and extended and requires a high degree of experience and endurance.

The investigations shown reveal that the main reason for the required iterations is primarily that in the conventional tuning, biquad filters are still used in the adjustment of the cross-over filters and for equalizing the amplitude response. With this kind of filters, however, it is not only the amplitude response which is changed in the tuning of the sound system but the entire phase response is influenced in an unintended manner as a result of which the adjustment of the phase in the overall system, which has been found once by adjusting the delay lines, changes again.

In multi-channels sound systems as are normally used in applications in motor vehicles, this leads to different interferences which, apart from the tonality, additionally change the localization of the sounds and the spatial impression, that is to say the auditory perspective of the audio signals presented such as, for example, music. As a consequence of these different interferences, some acoustic poles and nulls of the overall transfer function of the sound system are displaced as a result of which new changes in the adjustments inevitably become necessary which, due to the change in phase, again shift the acoustic pole positions and nulls. This explains why the conventional method of tuning a sound system must be performed iteratively.

The tuning of a sound system over the various stages is much simpler if the use of biquad filters is completely avoided in the filter design in the amplifier of the sound system and, instead, zero-phase or linear-phase filters of the same length are used. As a result, the adjustment of the phase response, once found, does not change again by tuning these filters and the unwanted mutual interaction of the individual stages of the tuning does not occur.

In this manner, the cross-over filters, the delay lines and the filters for equalizing the amplitude response can be tuned independently of one another. The number of iterations necessary for tuning the sound system remains small as a result of which the sound tuning is considerably simplified. Overall, it is even possible to achieve an even further improvement in the acoustic sound effect in this manner as verifiable by corresponding hearing tests in A/B comparison.

One way of automated adjustment of the cross-over filters in a sound system is, for example, to optimize the total harmonic distortion (THD) in order to keep the harmonic distortion as low as possible and to increase/maximize the sound pressure of the audio signal reproduction of the sound system. In addition, attention is paid to the fact that the filter slopes or, respectively, the filter orders of the filters used as cross-over filters move within a restricted range with filter orders of about 1st order to 4th order due to limited DSP power.

The procedure in the automatic adjustment of the cross-over filters is as follows:
1. Measuring the harmonic distortion over frequency for the individual channels of the sound system.
2. Grouping the loudspeakers which play together with respect to a listening position (for example listening position front left with, for example, high-frequency, center-frequency and woofer loudspeakers allocated to this listening position).
3. Defining an appropriate frequency range within which the cut-off frequencies of the cross-over filters may be varied where a maximum permissible harmonic distortion of two loudspeakers of a group which overlap in their frequency response may be used as a threshold.
4. Varying the cut-off frequencies of the cross-over filters within the range previously defined and varying the filter slopes (filter orders) of the cross-over filters in order to achieve a maximization of the acoustic sound pressure level of the reproduction of the sound system.

The automatic tuning of the delay lines, which takes place next according to the above-specified order, for establishing the phase response of the sound system is discussed below. One aspect which is hardly considered or even not at all in the multiplicity of known automatic algorithms for equalizing sound systems is the automatic adjustment of channel delays. In the past, the delay times of the delay lines were frequently set for different seat positions in the vehicle (driver- or codriver-specifically) and it was possible to choose between these individual presettings in most cases. In the present case, by comparison, the delay times of the delay lines, just like those of the equalizing and cross-over filters belonging to the respective, symmetrically arranged loudspeakers, usually are mostly symmetrically tuned in order to achieve acoustics which are optimized in the entire interior space of the vehicle, if possible. Good delay tuning is mainly distinguished by the fact that the acoustics become more spatial, become detached from the loudspeakers and the localization of the stage and the instruments on the stage (staging) becomes clearer.

From the investigations described above, it has been found that the energy decay curve (EDC) is suitable for assessing the quality of a delay tuning of the sound system performed. The investigations also showed that on the basis of this energy decay curve a good spatial image of the acoustics (auditory perspective) can be inferred when its variation in the time/frequency diagram exhibits an exponential drop. Furthermore, the present investigations show that the highest possible reduction in reverberation must be achieved for sound components of the sound system, the level of which is above the masking thresholds of this exponentially dropping curve, in order to achieve an optimum auditory perspective of the sound effect.

A further result of the investigations performed is that the reverberation permissible in the context of good auditory perspective is frequency-dependent and that the duration of this reverberation must decrease with increasing frequency in order to achieve a sound effect of the sound system which is felt to be positive. As has already been illustrated above, these variations of the energy decay curves determined and to be achieved by an automated procedure are based on psychoacoustic masking effects of the human ear, particularly on the effect of post-masking in time. The automatic tuning method only processes the adjustment of the individual delays such as to achieve a desired shape of the EDC, which should preferably have an exponentially shape, as previously described.

There are various psychoacoustic models which are capable of simulating this temporal behavior of the human ear. One of these models is again the gamma tone filter bank discussed above. If then a target function to be achieved by the automatic tuning of the sound system is to be generated which takes into consideration the psychoacoustic properties of the human ear, the impulse response of the complete analysis and synthesis unit of the gamma tone filter bank is recorded and used as target function for an adaptive filter used for system identification. A required impulse response or, respectively, the transfer function of an unknown system, can be approximated with sufficient accuracy by using adaptive filters in a recursive method. Adaptive filters are understood to be digital filters which are implemented with the aid of algorithms on digital signal processors (DSP) and which adapt their filter coefficients to the input signal in accordance with a predetermined algorithm.

Figure 20:
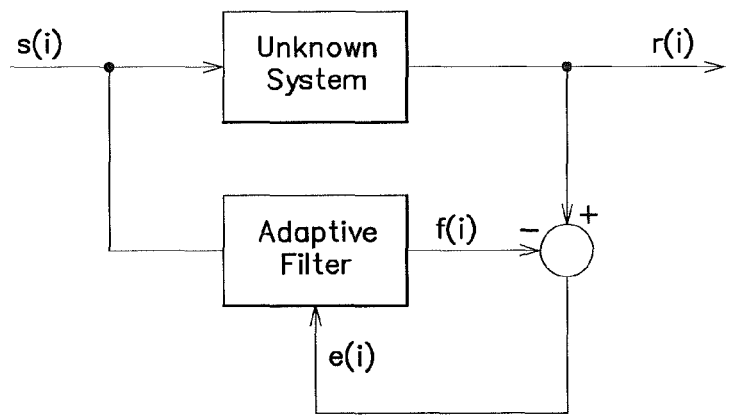
FIG. 20 is a block diagram showing the basic structure of an adaptive filter.

FIG. 20 shows the principle of adaptive filters. An "unknown system" is assumed to be a linear, distorting system, the transfer function of which is required. To find its transfer function, an adaptive system is connected in parallel with the unknown system. A reference signal r(i) is distorted by the unknown system. From this, an output f(i) of the adaptive filter is subtracted and thus an error signal e(i) is generated. The filter coefficients are typically adjusted by iteration by using the LMS (Least Mean Square) method or specialized LMS methods derived from this, in such a manner that the error e(i) becomes as small as possible as a result of which f(i) approximates r(i). From this, the unknown system, and thus also its transfer function, are approximated.

The automatic tuning of the equalizers takes place, e.g., in the order specified above. In sound systems for passenger spaces of motor vehicles, the resultant amplitude response should be matched to a target curve which drops with increasing frequency, that is to say has a certain low-pass characteristic. This target frequency response can then also be used as target function for an adaptive filter for system identification or it can be used as weighting function for the gamma tone filter bank described above as a result of which the target specifications for tuning the phases (delay lines) and equalizing the amplitude response can be optionally combined with one another.

Figure 21:
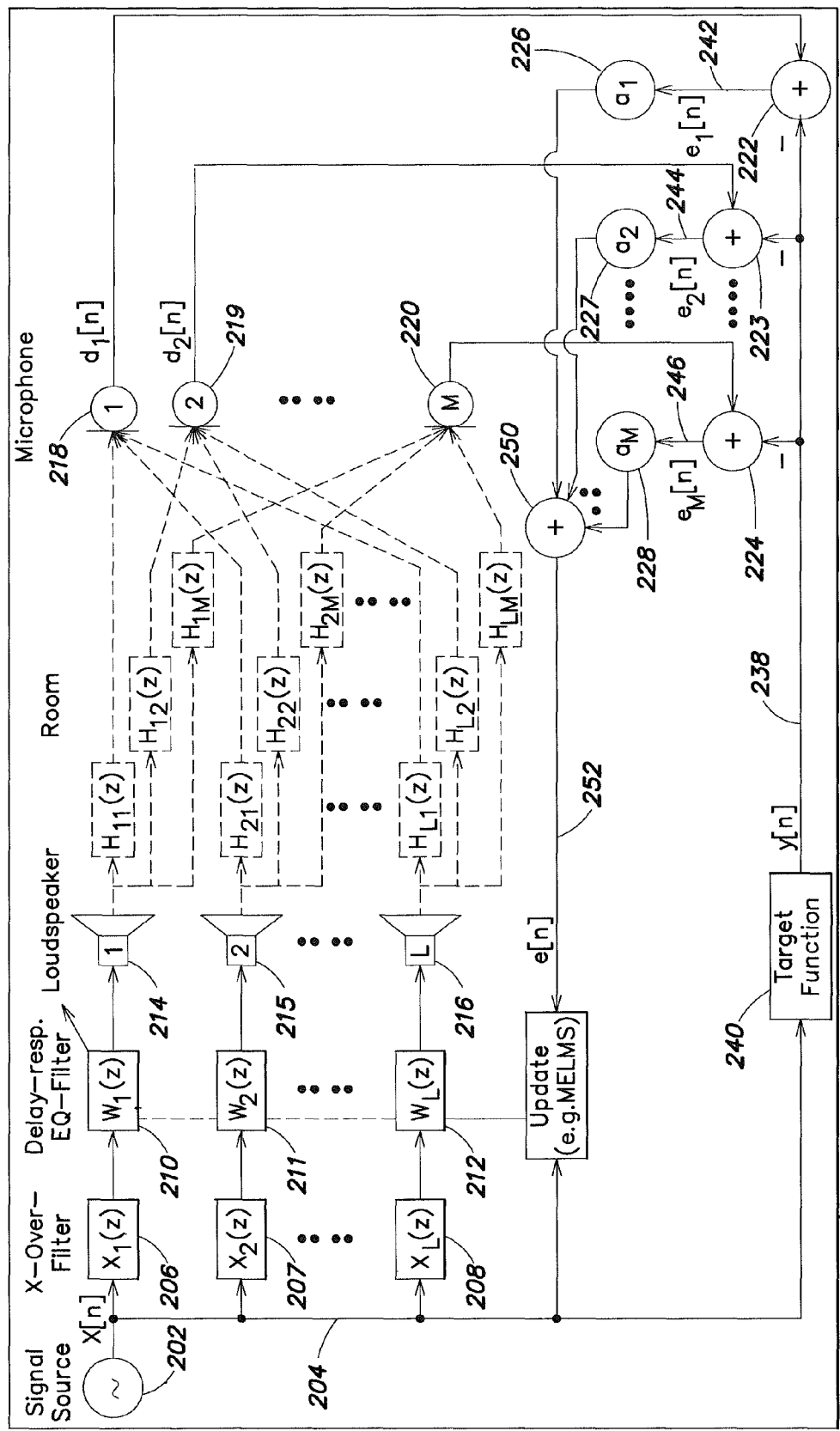
FIG. 21 is a block diagram of an arrangement for automatic adjustment of the delay time (phase) or equalization having an adaptive system.

FIG. 21 is a block diagram of an arrangement 200 for the automated tuning of sound systems in the passenger space of motor vehicles. The arrangement of FIG. 21 comprises a signal source 202 for generating an audio signal x[n] on a line 204 and a number of cross-over filters (X-over filters) $X_1(z)$ to $X_L(z)$ 206-208, an equally large number of adaptive filters $W_1(z)$ to $W_L(z)$ 210-212 for tuning the phases or, respectively, equalizing the amplitude response of the sound system (delay or EQ filters, resp.) and an equally large number of loudspeakers 214-216. The arrangement of FIG. 21 also comprises a number of microphones 1 to M 218-220, an equally large number of adding elements 222-224 and an equally large number of weighting factors $a_1$ to $a_M$ 226-228. Furthermore, the arrangement comprises the target function for the adaptive filtering of the signal of the signal source and the functional unit (update (e.g. MELMS)) for the adaptive adaptation of the coefficients of the multiplicity of adaptive filters $W_1(z)$ to $W_L(Z)$ for tuning the phases or, respectively, equalizing the amplitude response of the sound system (delay and EQ filters, resp.).

According to FIG. 21, the wide-band output signal x[n] on the line 204 is initially split by the multiplicity of cross-over filters $X_1(z)$ to $X_L(z)$ 206-208 into narrow-band signals which are supplied to the equally large multiplicity of in each case associated adaptive filters $W_1(z)$ to $W_L(Z)$ 210-212. In this arrangement, the cross-over filter $X_1(z)$ 206 is followed by the adaptive filter $W_1(z)$ 210, the cross-over filter $X_2(z)$ 207 is followed by the adaptive filter $W_2(z)$ 211, and the cross-over filter $X_L(Z)$ is followed by the adaptive filter $W_L(Z)$ which is followed by. The automated tuning of the cross-over filters as first step in the order, as can be found in the investigations, of tuning the individual components of a sound system in the passenger space of a motor vehicle has already been described above. The partial signals filtered by the multiplicity of cross-over filters $X_1(z)$ to $X_L(Z)$ 206-208 and the equally large multiplicity of in each case associated adaptive filters $W_1(z)$ to $W_L(Z)$ 210-212 are supplied to a loudspeaker, connected downstream in a corresponding manner, of the plurality of loudspeakers 1 to L according to FIG. 21.

Furthermore, the acoustic signals delivered by the loudspeakers 1 to L 212-216 of the sound system into the space, in this case into the passenger space of a motor vehicle, and modified by the room transfer function are picked up by the plurality of microphones 1 to M 218-220 and are in each case converted into electrical signals $d_1[n]$ to $d_M[n]$. In this arrangement, each individual one of the microphones 1 to M receives acoustic signals from all of the multiplicity of loudspeakers 1 to L. From the point of view of each individual one of the microphones 1 to M, this results in a plurality of room transfer functions H(z) for the transmission of the acoustic signals of the loudspeakers 1 to L to this individual microphone, that is to say a total of M*L room transfer functions H(z). These room transfer functions between the plurality of loudspeakers 1 to L and the plurality of microphones 1 to M are generally called $H_{1m}(z)$, where 1 designates the respective loudspeaker of the multiplicity of loudspeakers 1 to L and m designates the respective microphone of the multiplicity of microphones 1 to M, between which the transfer function $H_{1m}(z)$ exists. Thus, for example, $H_{21}(z)$ designates the transfer function of the room for the path of the acoustic signal from the loudspeaker 215 to the microphone 218 and $H_{1M}(z)$ designates, for example, the transfer function of the room for the path of the acoustic signal from the first loudspeaker 214 to the microphone 220.

From the sum of all L acoustic signals of the plurality of loudspeakers 1 to L, received and modified by the room transfer functions $H_{1m}(z)$, each of the multiplicity of microphones 1 to M forms an electrical signal $d_m[n]$. Thus, for example, the second microphone 219 forms an electrical output signal $d_2[n]$ which is formed by the superposition of the received acoustic signals of the multiplicity of loudspeakers 1 to L, the acoustic signal of the first loudspeaker 214 being modified by the room transfer function $H_{12}(z)$ in this case, the acoustic signal of the second loudspeaker 215 being modified by the room transfer function $H_{22}(z)$, and so on, up to loudspeaker L, the acoustic signal of which is modified by the room transfer function $H_{L2}(z)$.

Furthermore, according to FIG. 21, a signal y[n] on a line 238 is formed from the signal x[n] of the signal source via a predetermined target function 240. According to FIG. 21, the signal y[n] on the line 238 is formed from the signal x[n] on the line 204 via the predetermined target function is in each case subtracted from the output signals of the multiplicity of microphones 1 to M via a respective summing element in this processing path in a single processing path. The subtraction of the signal y[n] from the signal $d_1$[n] of the first microphone 218 results in signal $e_1$[n] on line 242 ($e_1$[n]=$d_1$[n]−y[n]), the subtraction of the signal y[n] from the signal $d_2$[n] of the second microphone 219 results in signal $e_2$[n] on line 244 ($e_2$[n]=$d_2$[n]−y[n]), and so forth up to signal $e_M$[n] on line 246 which is formed by subtracting the signal y[n] from the signal $d_m$[n] of the third microphone 220 ($e_M$[n]=$d_M$[n]−y[n]). As shown above, this corresponds to the typical procedure in adaptive filters, the signals $e_1$[n] to $e_M$[n] also being called error signals and being used in the further course to correspondingly change the filter coefficients of the adaptive filters in the next operating step in order to ideally achieve an error signal with the value zero after a finite series of steps.

According to FIG. 21, the signals $e_1$[n] to $e_M$[n] are weighted with in each case corresponding and adjustable factors $a_1$ to $a_M$ in the present case as a result of which the error signals $e_1$[n] to $e_M$[n] are weighted for the adaptive filtering via which it is possible to specify how precisely the predetermined target function is to be approximated for the respective listening positions or the microphones allocated to this listening position, respectively, in the passenger space of the motor vehicle. Following this, according to FIG. 21, the weighted error signals $e_1$[n] to $e_M$[n] are summed together with the aid of a further summing element 250 which results in error signal e[n] on line 252, which is again a wide-band signal, as input variable for the adaptive filtering. Referring still to FIG. 21, by comparing these error signals e[n] with the signal x[n] of the signal source, the filter coefficients of the adaptive filters $w_1(z)$ to $W_L(z)$ are recursively changed via the function block update (e.g., MELMS) for example with the aid of the multiple error least mean square algorithm until the error function e[n] is minimized. This corresponds to the typical application of adaptive filters and leads to the transfer characteristic of the room, in this case the passenger space of the motor vehicle, corresponding to the predetermined target function as desired due to the preceding and adaptive filtering.

The block diagram shown in FIG. 21 shows how the general case of a sound system with L loudspeakers and M microphones can be solved, according to an aspect of the invention, for example with the aid of the MELMS (Multiple Error Least Mean Square) algorithm by using an adaptive method and target functions based on the psychoacoustic characteristics of the human ear. It is assumed that the adaptation takes place "off line" since normally the previously measured room impulse responses from the vehicle cabin are preprocessed, for example with the aid of smoothing algorithms. This smoothing of the room impulse responses is performed in order to prevent that the filters finally produced for equalizing the sound system exhibit unwanted extreme or unachievable characteristics such as, for example, very narrow-band rises with high quality or extremely high gains.

It is also an advantage to perform the measurements at the required seat positions, which are performed with the aid of the microphones 1 to M in accordance with the representation in FIG. 21, not with a single microphone per seat or listening position in each case but, instead, to use several microphones at different mounting locations for each seat position in order to obtain from these subsequently a spatial averaging of the impulse responses for this listening position. It is unimportant in this regard whether the spatial averaging is performed on the basis of individual measurements or directly when recording the room impulse responses. In the latter case, the recording of the room impulse responses can be performed, for example, by using a multiplexed microphone array which continuously and periodically switches between the individual microphones of the array. In both cases, spatial averaging is achieved that represents the prerequisite for a robust design of the filters for equalizing.

In addition, the factors $a_1$ to $a_M$ can be used for weighting the target function for the adaptive filtering via which it can be specified how precisely the predetermined target function is to be approximated for the respective listening positions in the passenger space of the motor vehicle. In principle, it is initially appropriate to perform the weighting of the listening positions in such a manner as is usually chosen in the manual tuning process of the sound system by acousticians, namely with greater emphasis on the front listening positions and corresponding lesser weighting of the rear listening positions in the passenger space. In principle, the arrangement according to FIG. 21 provides the possibility of carrying out arbitrary combinations of weighting and checking their sound effect. With regard to the associated effort, it is of great advantage if the tuning of the sound system can be performed in automated manner, according to of the invention, as a result of which a multiplicity of weighting distributions over the listening positions can be effectively investigated with respect to their sound impression.

Figure 22:
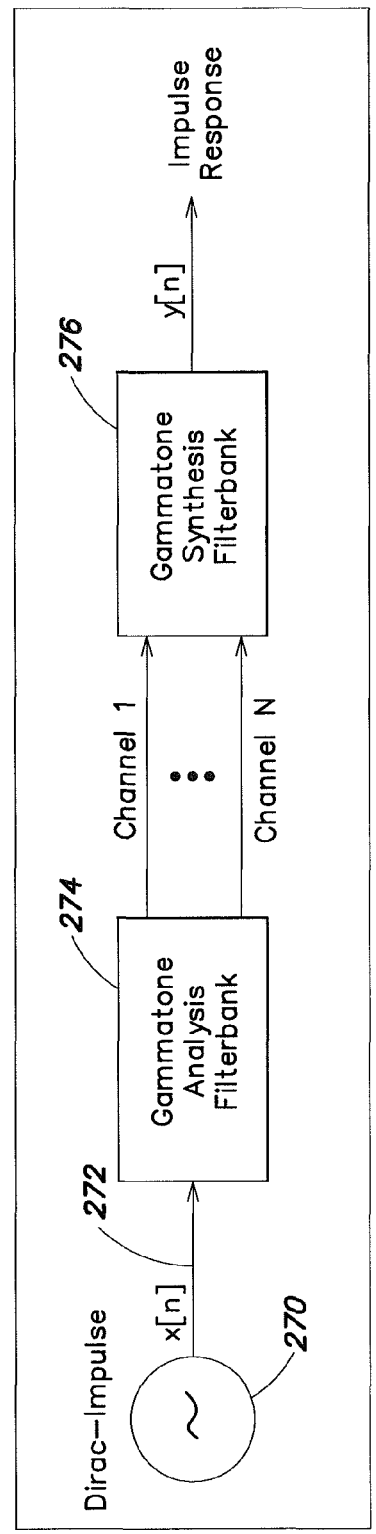
FIG. 22 is a diagram showing the basic structure of an arrangement for obtaining a target function as basis for tuning the delay time (phase)

FIG. 22 shows the procedure for determining the target function for the adaptive filtering with regard to the automated tuning of the phases and/or equalizing the amplitude response with hearing-corrected gamma tone filters. FIG. 22 comprises a generator 270 for generating Dirac impulses x[n] on a line 272 for measuring the impulse response with regard to phase, a gamma tone filter bank 274 for the analysis (hearing-corrected filtering) including N=100 gamma tone filters which are distributed with corresponding equivalent rectangular bandwidth (ERB) over the frequency range to be considered, and a gamma tone filter bank 276 for synthesizing the impulse response, also consisting of N=100 gamma tone filters which are distributed with corresponding equivalent rectangular bandwidth (ERB) over the frequency range to be considered.

Figure 23:
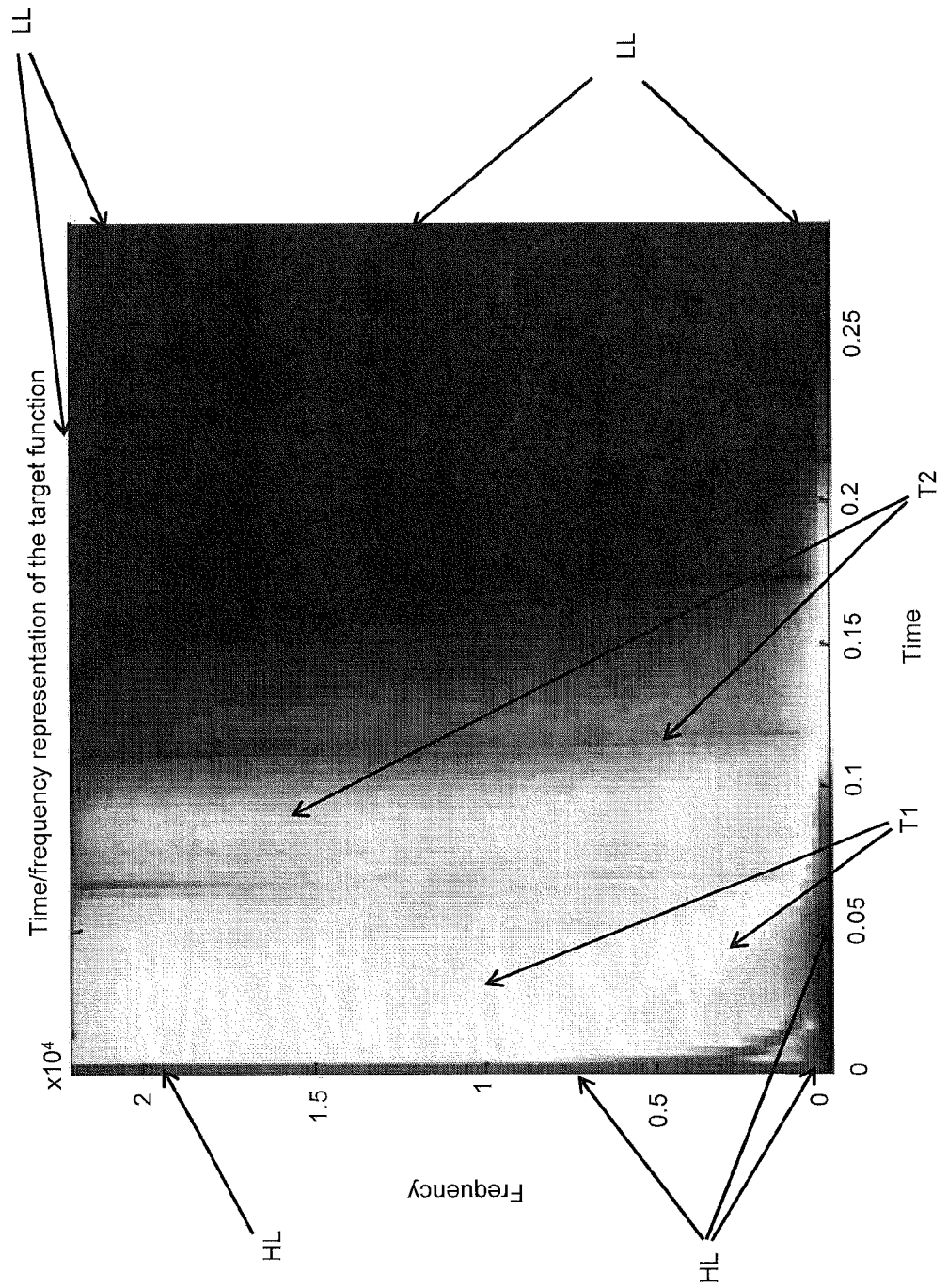
FIG. 23 is a time/frequency representation of the target function for tuning the delay time (phase) or equalization.

FIG. 23 shows an exemplary result of the time/frequency characteristic of the target function, to be achieved by the hearing-corrected method according to the embodiment of the invention described above, time being plotted along the abscissa of the representation in FIG. 23 and the ordinate of the representation in FIG. 23 designating the frequency. Again, high levels achieved are plotted light grey and marked with the label HL and low levels are plotted dark grey and marked with the label LL. The transition from high to low levels can be seen as transitions from a brighter to a darker greyscale and are marked with the labels T1 and T2. It can be seen that the time/frequency characteristic achieved by the psychoacoustic model of the gamma tone filter banks results in very uniform transitions from high to low levels, where the typical slower decay at low frequencies can be seen as also in the measurement results according to FIG. 1.

Figure 24:
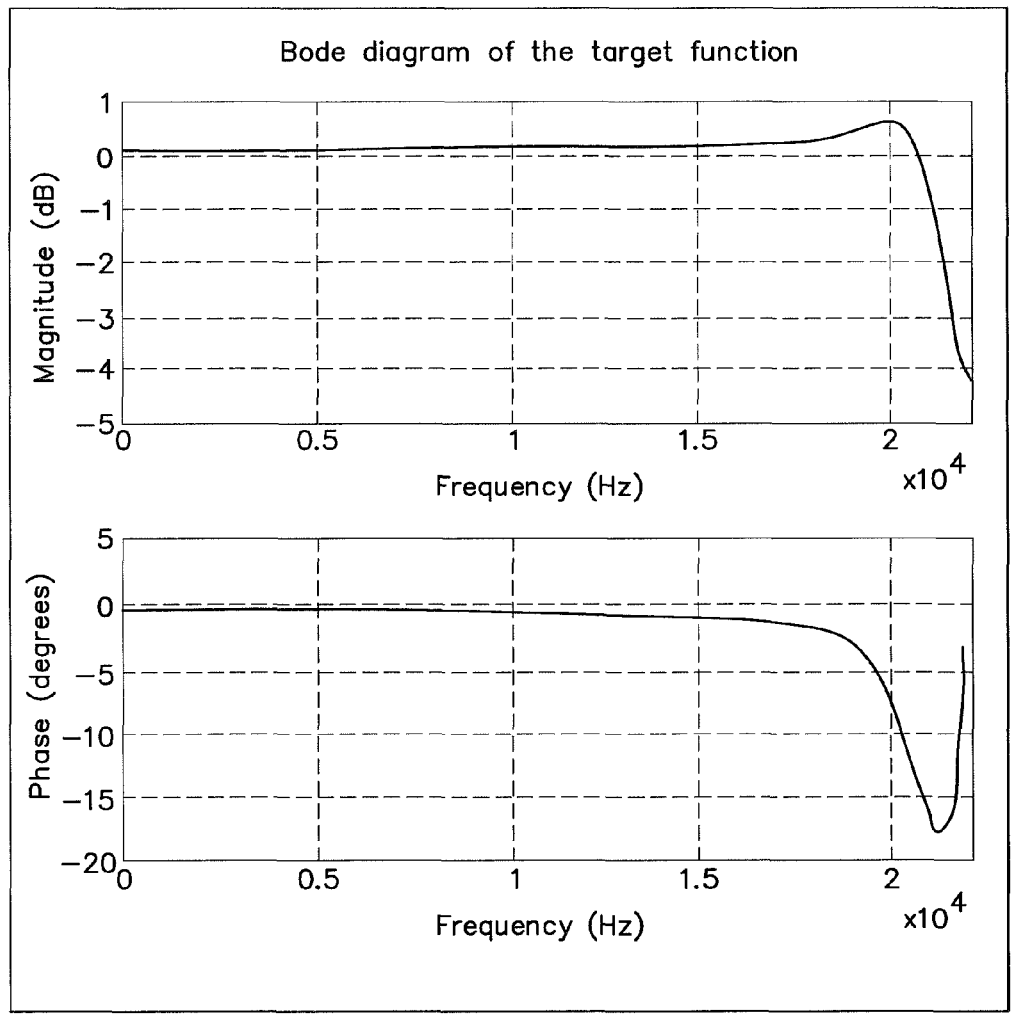
FIG. 24 is a bode diagram of the target function for tuning the delay time (phase) or equalization.

FIG. 24 shows the Bode diagram of the target function from FIG. 23 with regard to variation of level (upper diagram in FIG. 24) and phase (lower diagram in FIG. 24). In both representations, the frequency is plotted in logarithmic scaling along the abscissa and the ordinate of the upper diagram in FIG. 24 designates the level in dB and the ordinate of the lower diagram in FIG. 24 designates the phase. It can be seen from FIG. 24 that an explicit target frequency response for equalizing the amplitude response has not yet been introduced between analysis and synthesis stage, that is to say this target function only comprises the target function for tuning the phase (delay lines). The deviations of the amplitude response from the ideal zero line (top diagram in FIG. 24), which can be seen at high frequencies in FIG. 24, can be explained by the restricted number of gamma tone filters used for the analysis and synthesis and are not especially considered in the further course since they are generally not thought to be disturbing for the overall listening impression.

As explained above, the adaptive filter of the arrangement according to FIG. 21 can optionally also be used for determining not only the target function of the phase response of the sound system but, at the same time, also taking into consideration the boundary conditions for the target function for equalizing the amplitude response. This then results in a common target function for the adaptive filtering according to FIG. 21. To produce such a common target function, the target function for equalizing the amplitude response must first be determined.

It represents a typical method for this purpose to use so-called pink noise for describing the target function of the amplitude response in motor vehicles. Pink noise is used for assessing the sound intensity of loudspeakers. In contrast to white noise, the level of pink noise drops at 3 dB/octave towards higher frequencies. The energy content of such a noise signal is thus constant per octave and thus takes into consideration in a first approximation the frequency-dependent behavior of the human ear (critical bandwidth and formation of loudness, see above).

Figure 25:
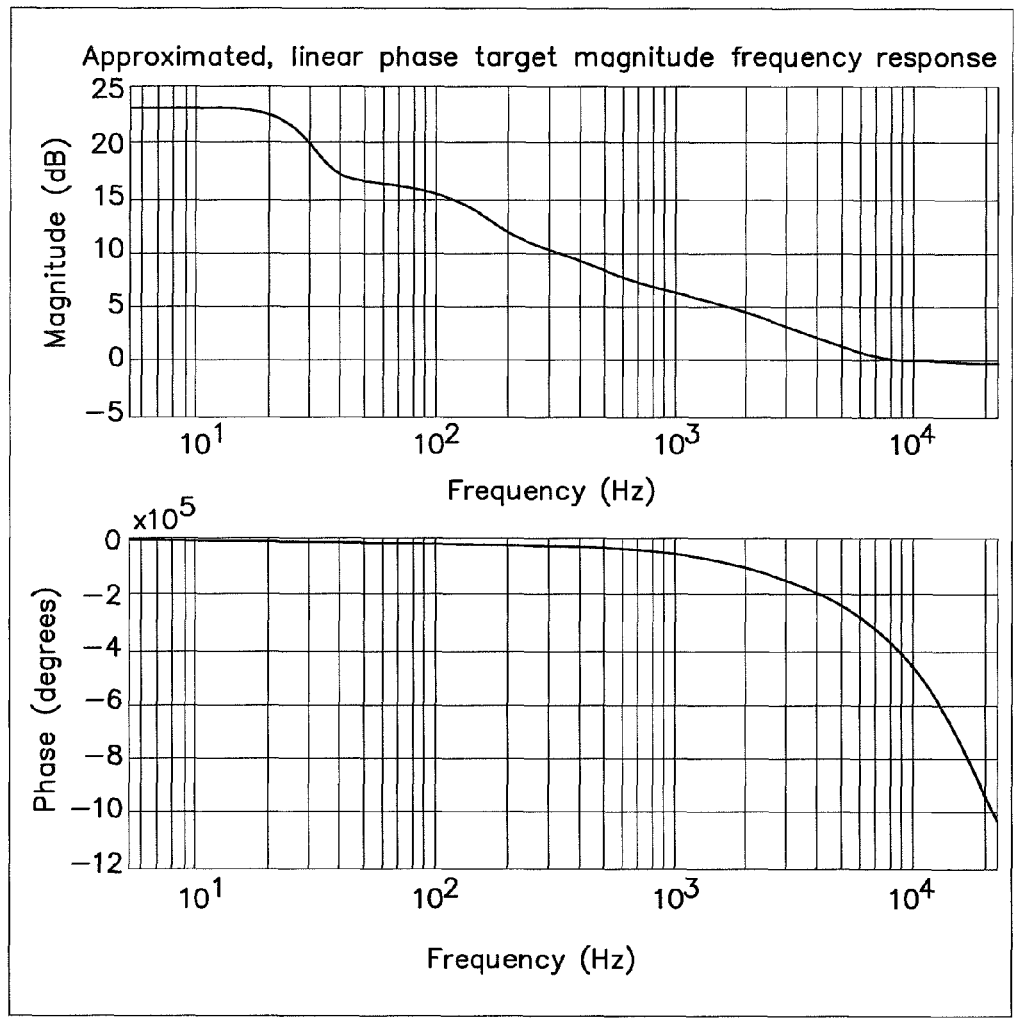
FIG. 25 is a diagram illustrating the target frequency response for pink noise.

FIG. 25 shows the target function of the adaptive filtering for the amplitude response (pink noise) in motor vehicle applications, again shown as a Bode diagram. FIG. 25 shows the variation of the level (upper diagram in FIG. 25) and of the phase (lower diagram in FIG. 25). In both representations, the frequency is plotted in logarithmic scaling along the abscissa and the ordinate of the upper diagram in FIG. 25 designates the level in dB and the ordinate of the lower diagram in FIG. 25 designates the phase.

Figure 26:
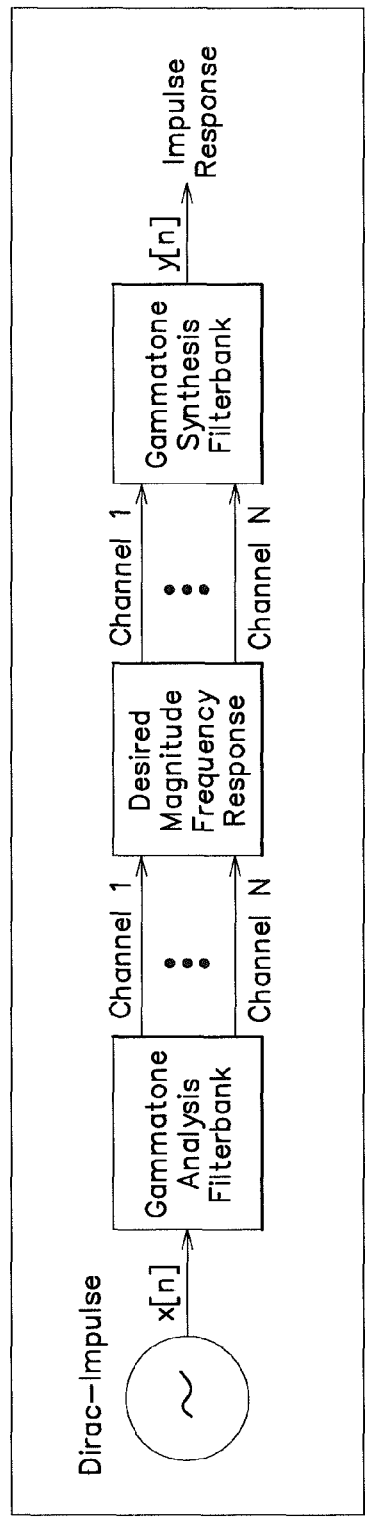
FIG. 26 is a block diagram illustrating a system for obtaining a target function for the tuning of delay lines and filters.

If then the target function of the amplitude response, shown in FIG. 25, is inserted between the analysis unit and the synthesis unit, that is to say the corresponding gamma tone filter banks, as is shown in FIG. 26, the new target function of the adaptive filtering according to FIG. 21 shown in the text which follows, is obtained which now comprises the joint target function for tuning the phase (delay lines) and equalizing the amplitude response. FIG. 26 represents the extension of FIG. 22 by the target function for equalizing the amplitude response, inserted between the analysis unit and the synthesis unit.

Figure 27:
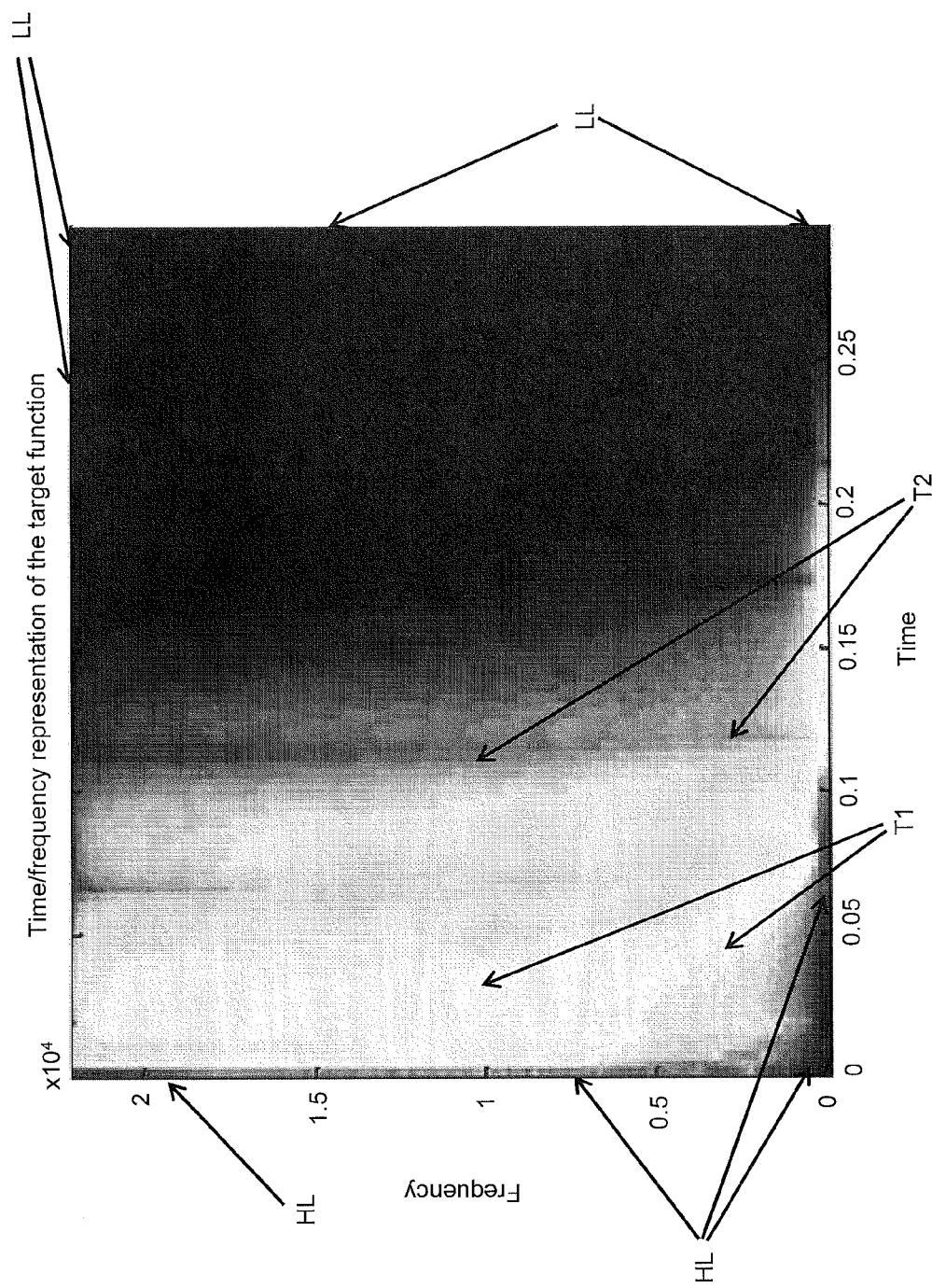
FIG. 27 is a time/frequency representation of the common target function for the tuning of delay lines and filters.

Correspondingly, the joint target function for tuning the sound system by the adaptive filtering according to FIG. 21, shown in FIG. 27, is obtained. FIG. 27 shows the time/frequency characteristic of the target function, time being plotted along the abscissa of the representation in FIG. 27 and the ordinate of the representation in FIG. 27 designating the frequency.

Figure 28:
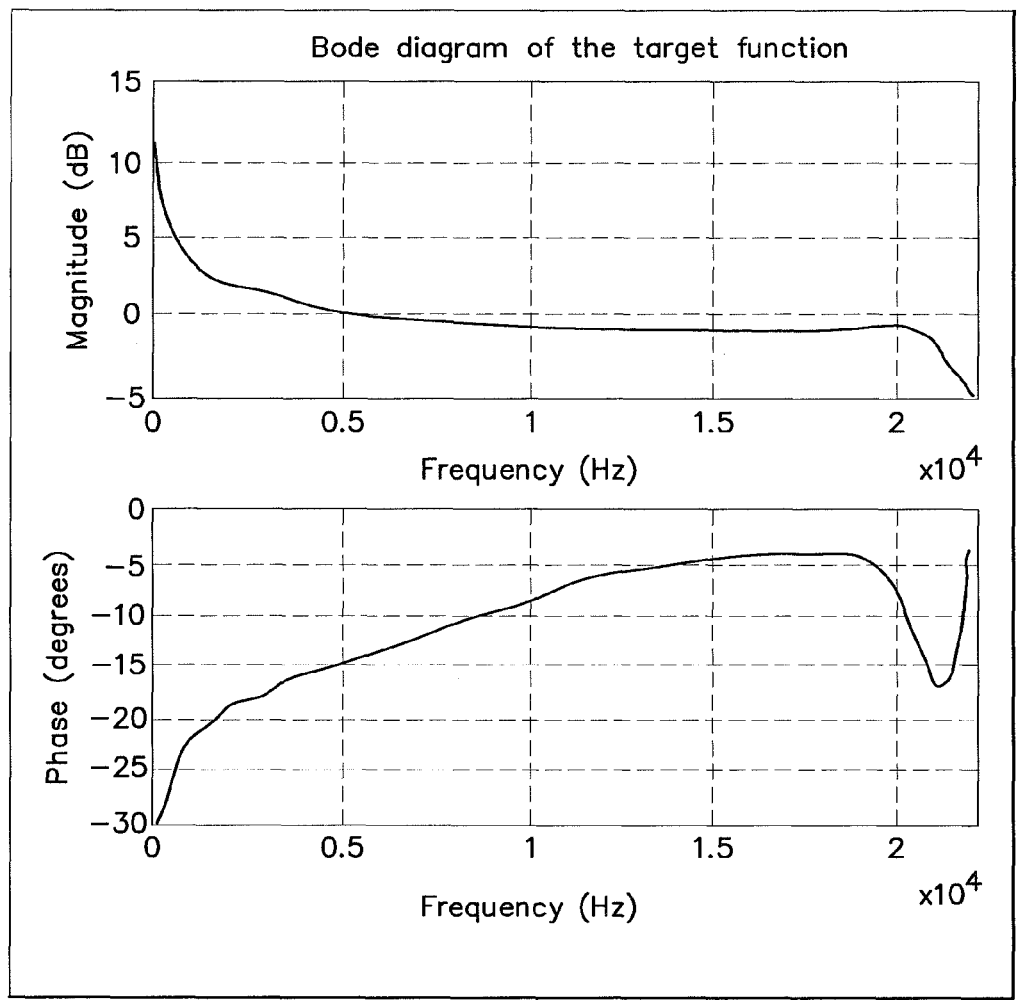
FIG. 28 is a bode diagram of the target function for joint tuning of delay lines and filters.

FIG. 28 shows the Bode diagram of the target function from FIG. 27 with regard to the variation of level (upper diagram in FIG. 28) and phase (lower diagram in FIG. 28). In both representations, the frequency is plotted in logarithmic scaling along the abscissa, the ordinate of the upper diagram in FIG. 28 designates the level in dB and the ordinate of the lower diagram in FIG. 28 designates the phase. It can be seen from FIG. 28 that now the target frequency response is also taken into consideration for equalizing the amplitude response, that is to say the target function according to FIG. 28 now comprises the joint target function for tuning the phase (delay lines) and tuning the equalizing of the amplitude response. This becomes particularly clear in a comparison of the top two representations (level variation over frequency) from FIGS. 24 and 28, which shows the typical overshoot, found in the investigations, of the amplitude response at low frequencies ($\leq 500$ Hz) which becomes clearly visible by adding the target function of this amplitude response to the amplitude response of the delay tuning (FIG. 24) in FIG. 28.

Thus, all necessary target functions based on psychoacoustic features of the human ear, such as, for example, spectral and temporal masking effects, are defined which, as target specification, are the prerequisite for the automated process for tuning sound systems, shown in FIG. 21. An intermediate step of the results of the investigations performed, namely the use of linear-phase filters for equalizing the amplitude response and for the cross-over filters for decoupling the phase influence of various tuning steps leads to a significant simplification of the tuning process without necessitating an iterative method. This intermediate step of the results can also be used as a distinct simplification of manual tuning of sound systems by acousticians and sound engineers, assuming the use of linear-phase filters (turning away from the time-consuming iterative procedure)

Although various examples to realize the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Such modifications to the inventive concept are intended to be covered by the appended claims.

What is claimed is:

1. A method for automated tuning of a sound system, the sound system comprising delay lines, equalizing filters, and at least two loudspeakers, the method comprising the steps of:
   reproducing a useful sound signal through the loudspeakers;
   measuring sound pressure values at at least one location;
   providing a target transfer function for tuning the delay lines and the equalizing filters of the sound system, the target transfer function representing a desired transfer characteristics of the sound system;
   adjusting the delay of the delay lines; and
   adjusting amplitude responses of the equalizing filters such that the actual transfer characteristics of the sound system approximates the target function.

2. The method of claim 1, where the sound system further comprises at least one cross-over filter, the method comprising the step of:
   adjusting the cut-off frequency of the cross-over filter such, that the total harmonic distortion is reduced.

3. The method of claim 2, where the cross-over filters comprise linear-phase filters.

4. The method of claim 2, where a linear-phase adaptive filter is used to implement a delay line and an equalization filter, thus enabling an independent adjusting of delay and amplitude response of the equalization filters and the cross over filters without mutual influence.

5. The method of claim 4, where the delay of the delay lines is done by adjusting the phase of the linear adaptive filter.

6. The method of claim 5, where the amplitude responses of the equalization filter is performed by adjusting filter-coefficients of the linear adaptive filter.

7. The method of claim 2, where the cut-off frequencies of the cross-over filters are adjusted before the delay of the delay lines.

8. The method of claim 1, where the target function incorporates psychoacoustic characteristics of the human ear.

9. The method of claim 8, where the psychoacoustic charateristics of the human ear comprise spectral and temporal masking effects and the spectral resolution of the human ear.

10. The method of claim 1, where the sound pressure is measured at a plurality of positions yielding a plurality of sound pressure signals.

11. The method of claim 10, where the plurality of positions are located within a hearing space.

12. The method of claim 11, where the hearing space is a passenger space of a motor vehicle.

13. The method of claim 10, further comprising the steps of:
calculating a desired output signal from the useful sound signal using the target function, and
calculating error signals by subtracting the measured sound pressure signals from the desired output signal.

14. The method of claim 13, further comprising the steps of:
generating a total error signal by calculating the weighted sum of the error signals, the error signals being multiplied with weighting factors before summation, and
adjusting the phase and the amplitude responses of the adaptive filters such, that the total error signal is reduced.

15. The method of claim 14, where a Multiple Error Least Mean Squares (MELMS) algorithm is employed for reducing the total error signal.

16. The method of claim 1, further comprising:
calculating an energy decay curve (EDC) of the measured sound pressure for assessing the quality of the tuning of the phase or of the delay lines.

17. The method of claim 16, where the delay of the delay lines is tuned to reduce reverberations whose level is above the frequency dependent masking threshold.

18. The method of claim 1, where the amplitude response and the phase response of the target function for tuning the sound system are calculated from an impulse response of hearing-corrected filter banks, comprising gamma tone filters simulating the frequency and time characteristics of the human ear.

19. The method of claim 1, where the delay of the delay lines is adjusted before the amplitude responses of the equalizing filters.

* * * * *